(12) United States Patent
Wessels et al.

(10) Patent No.: US 6,605,151 B1
(45) Date of Patent: Aug. 12, 2003

(54) OXIDE THIN FILMS AND COMPOSITES AND RELATED METHODS OF DEPOSITION

(75) Inventors: Bruce W. Wessels, Wilmette, IL (US); Brent H. Hoerman, Breinigsville, PA (US); Feng Niu, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 09/726,238

(22) Filed: Nov. 29, 2000

Related U.S. Application Data

(60) Provisional application No. 60/167,768, filed on Nov. 29, 1999.

(51) Int. Cl.[7] ............................................. C30B 25/22
(52) U.S. Cl. .................. 117/103; 117/108; 117/944; 117/148; 117/33.1
(58) Field of Search .................... 117/103, 108, 117/944; 148/33.1

(56) References Cited

U.S. PATENT DOCUMENTS

| | | | |
|---|---|---|---|
| 5,323,023 A | 6/1994 | Fork | |
| 5,418,216 A | 5/1995 | Fork | |
| 5,482,003 A | 1/1996 | McKee et al. | |
| 5,776,621 A | 7/1998 | Nashimoto | |
| 5,830,270 A | 11/1998 | McKee et al. | |
| 6,046,464 A | * 4/2000 | Schetzina | 257/96 |
| 6,118,571 A | 9/2000 | Wessels et al. | |
| 6,122,429 A | 9/2000 | Wessels et al. | |

FOREIGN PATENT DOCUMENTS

| EP | 0055459 A | 7/1982 |
|---|---|---|
| JP | 5-194085 | * 8/1993 |

OTHER PUBLICATIONS

Chern, incommensurate grwoth and interface stability in MgO/SrTiO (001), Surface Science vol 378 pp. 183–191 1997.*

Chern et al., "Magnetization Study in Fe3O4/MgO superlattices", IEEE Transactions on Magnetics vol 33. No. 5 pp. 3700–3702 Sep. 1997.*

Gao et al., "Synthese of epitaxial films of Fe3O4 and Fe2O3 with varios low–index orientations by oxygen plasam assisted molecular beam epitaxy", Journal of Vacuum Science technology A. 15(2) Mar./Apr. 1997 pp. 332–339.*

Hayama, Togun, Ishida, "Heteroepitaxial growth of $Al_2O_3$ film on Si using dimethylethylamine–alane and $O_2$", Feb., 1997, pp. 433–437, Journal of Crystal Growth 179, Elsevier Science, B.V., Japan.

Bade, Baker, Kingon, Davis, Bachmann, "Deposition of oxide films by metal–organic molecular–beam epitaxy", Dec. 1989, pp. 327–331, J. Vac. Sci. Technol. B 8 (2), Mar./Apr. 1990, American Vacuum Society, North Carolina, U.S.A.

Ikegawa, Motoi, "Growth of $CeO_2$ thin films by metal–organic molecular beam epitaxy", 1996, pp. 60–63, Thin Solid Films 281–282, Elsevier Science S.A., Japan.

(List continued on next page.)

Primary Examiner—Robert Kunemund
(74) Attorney, Agent, or Firm—Reinhart Boerner Van Deuren, s.c.

(57) ABSTRACT

Thin oxide films are deposited on substrates by metal-organic molecular beam epitaxy (MOMBE) and can be incorporated into a variety of composite materials. The composites/films are characterized by a combination of transmission electron microscopy, Auger spectrometry and atomic force microscopy. Analyzes indicate that the films directly deposited on substrates are stoichiometric and phase-pure. Carbon contamination of the films resulting from precursor decomposition was not observed.

19 Claims, 31 Drawing Sheets

OTHER PUBLICATIONS

King, Hsieh, Lichtenwalner, Kingon, "In situ deposition of superconducting $YBa_2Cu_3O_{7-x}$ and $DyBa_2Cu_3O_{7-x}$ thin films by organometallic molecular–beam epitaxy" Dec. 1991, pp. 3045–3047, Appl. Phys. Lett. 59 (23) Dec. 2, 1991, Department of Material Science & Engineering, North Carolina State University, Raleigh, North Carolina, U.S.A.

Kingon, Hsieh, King, Rou, Bachmann, Davis, "$PbTiO_3$ Thin Films by Chemical Beam Deposition", 1990, pp. 49–57, Mat. Res. Soc. Symp. Proc. vol. 200, Materials Research Society, Department of Materials Science & Engineering, North Carolina State University, Raleigh, North Carolina, U.S.A.

Niu, Hoerman, Wessels, "Growth and microstructure of MgO thin films on Si(100) substrates by metal–organic molecular beam epitaxy" Jan., 2000, pp. 74–77, Applied Surface Science 161, Elsevier Science B.V., Department of Materials Science and Engineering and Materials Research Center, Northwestern University, Evanston, IL, U.S.A.

Niu, Hoerman, Wessels, "Epitaxial thin films of MgO on Si using metalorganic molecular beam epitaxy" May 2000, pp. 2146–2152, J. Vac. Sci. Technol. B 18(4), Jul./Aug. 2000, American Vacuum Society, Department of Materials Science and Engineering and Materials Research Center, Northwestern University, Evanston, IL, U.S.A.

* cited by examiner

- Two tendencies >650°C

<650°C

-Two different growth mechanisms.

> 650 °C, surface reaction dominant

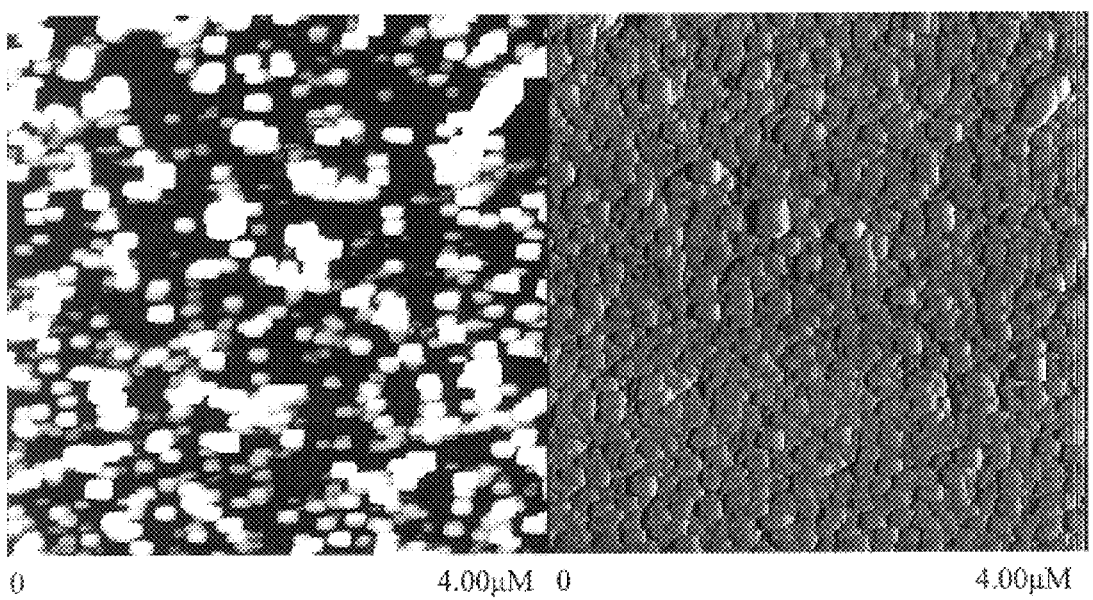
FIGURE 23A                    FIGURE 23B

OXIDE THIN FILMS AND COMPOSITES AND RELATED METHODS OF DEPOSITION

This application claims the benefit of Provisional Application No. 60/167,768, filed Nov. 29, 1999.

CONTRACTUAL ORIGIN OF THE INVENTION

The United States Government has rights in this invention pursuant to Grant No. DMR 9632472 from the National Science Foundation, Grant No. F49620-96-1-0262/P004 from the Department of the Army Advanced Research Projects Agency and Grant No. F49620-96-1-0460 from the Air Force Office of Scientific Research, all to Northwestern University.

FIELD OF THE INVENTION

This invention relates generally to oxide thin films and composites including such materials as can be derived from suitable metal precursors and/or prepared using molecular beam epitaxy techniques. In particular, the present invention relates to use and/or integration of such oxide films in a variety of devices.

BACKGROUND OF THE INVENTION

In recent years there has been increasing interest in thin oxide films as alternative high κ dielectrics. For example, one such material is MgO, which has a dielectric constant of 9.4. Because of its chemical stability and thermodynamic compatibility with silicon (Si), interfacial reactions should be minimal. To date, a variety of deposition techniques have been used to grow MgO thin films on Si including metalorganic chemical vapor deposition (MOCVD), B. S. Kwak, E. P. Boyd, K. Zhang, A. Erbil and B. Wilkins, Appl. Phys. Left., 54 25(1989); E. Fujii, A. Tomozawa, S. Fujii, H. Torii, M. Hattori and R. Takayama, Jpn. J. Appl Phys., 32, L1448 (1993); sputtering, S. Fujii, A. Tomozawa, E. Fujii, H. Torii, R. Takayawa and T. Hirao, Appl. Phys. Lett., 65(11), 1463 (1994); S. Kim and S. Hishita, Thin Solid Films, 281–282, 449(1996); M. Tonouchi, Y. Sakaguchi and T. Kobayashi, J. Appl. Phys., 62(3), 961(1987); Y. Li, G. C. Xiong, G. J. Lian, J. Li and Z. Gan, Thin Solid Films, 223,11(1993), laser deposition, T. Ishiguro, Y. Hiroshima and T. Inoue, Jpn. J. Appl. Phys., 35, 3537(1996); P. Tiwari, S. Sharan and J. Narayan, J. Appl. Phys., 69(12), 8358(1991); D. K. Fork, F. A. Ponce, J. C. Tramontana and T. H. Geballe, Appl. Phys. Left., 58(20), 2294(1991); S. Amirhaghi, A. Archer, B. Taguiang, R. McMinn, P. Barnes, S. Tarling and I. W. Boyd, Appl. Surf. Sci., 54, 205(1992); e-beam-assisted molecular, beam epitaxy (MBE) F. J. Walker, R. A. McKee, S. J. Pennycook and T. G. Thnndat, Mater. Res. Soc. Symp. Proc., 401, 13(1996); and the sol-gel method J. G. Yoon and K. Kim, Appl. Phys. Lett., 66(20), 2661(1995) However, as would be understood by those skilled in the art, deposition techniques of the prior art are accompanied by various shortcomings and/or deficiencies with respect to the use and applications described herein.

For instance, much current work has focused on the formation of dielectrics by chemical vapor deposition. Because such deposition techniques operate at pressures in excess of $10^{-3}$ Torr, oxidation of a silicon substrate prior to thin film deposition provides an unwanted formation of silicon dioxide. Other work has been performed using electron-beam evaporation of MgO onto Si in an oxygen ambient. The inherent mechanical difficulties associated with using electron-beam sources in an oxygen atmosphere has limited this approach, especially for large area coverage. The technique also requires atomistic control of the amount and type of atomic species deposited to enable epitaxy. This complication has further limited the success of this approach.

A related concern is the integration of functional components on substrates, for instance integration of a ferroelectric thin film on a semi-conductor substrate. It is often difficult to deposit/grow epitaxial thin films of the sort needed for optimal performance on such substrates because of interactive diffusion between the layers, oxidation of the substrate and similar such material or surface incompatibilities. Capping components, typically oxides, can be layered on the substrate to alleviate such difficulties for instance to act as a diffusion barrier. However, introduction of such components can present also promote substrate oxidation and the non-epitaxial growth of a component subsequently integrated thereon.

SUMMARY OF THE INVENTION

Given the problems and deficiencies in the art relating to the preparation and use of oxide thin films, there is a need for an improved approach to such films and composites so as to maximize the benefits available therefrom; e.g., for use thereof with integrated devices.

Accordingly, it is an object of the present invention to provide various deposition methods and techniques overcoming the problems and shortcomings of the prior art, including those described above, such that the resulting films can be used in conjunction with integrated systems and devices. It will be understood by those skilled in the art that one or more aspects of this invention can meet certain objectives, while one or more other aspects can meet certain other objectives. Each objective may not apply equally, in all instances, to every aspect of this invention. As such, the following objects can be viewed in the alternative with respect to any one aspect of this invention.

It can be an object of this invention to provide a thin film fabrication technique which combines the versatility of standard chemical vapor deposition with the molecular beam properties of conventional molecular beam epitaxy.

It can be another object of this invention to provide, in particular, for the use of metal organic molecular beam epitaxy (MOMBE) with suitable metal-organic precursors, such precursors having, without limitation: 1) a very low background pressure ($<10^{-7}$ Torr); 2) a single metal-containing volatile species in the molecular beam, 3) a high sticking coefficient, 4) and high long-term stability at the evaporation temperature (no decomposition or oxidation of the source materials), 5) an organic component/ligand accessible commercially or by known synthetic techniques, and 6) sufficient volatility ($>10^{-6}$ Torr) at low temperature.

It can also be an object of the:present invention to provide a method for deposition of thin films of nanometer dimensions (less than 50 nm, and preferably less than about 3 to about 10 nm) by molecular beam epitaxy techniques using pressures (oxygen and/or base) lower than those of one prior art and/or to achieve the film composition and/or morphology desired.

It can also be an object of the present invention to provide methods, processes, and/or techniques of the type described herein for the deposition of a variety of alkaline earth and rare earth oxides, from commercially-available metal precursors, without carbon contamination on substrates useful in the fabrication of integrated systems.

It can also be an object of the present invention to provide thin film metal oxides, the metal component thereof including but not limited to Ca, Zn, Cd, V, Rh, Pt, Th, Fe, Pd, Ga, Al, Be, U, Hf, La, Pr, Sm, Gd, Dy, Er, Yb, Sc, Th, Ti, Ba, Ce, Mg and Pb, such films as can be amorphous or provided with glass, crystalline, polycrystalline or epitaxial morphologies.

It can also be an object of the present invention to provide metal oxide films, such as those referenced above, for use in the fabrication of a variety of composites for subsequent integration, such composites including substrates of Si and Ge, or with compound (Group III-V and II-VI) substrates.

It can also be an object of this invention to provide a deposition technique which allows in situ film diagnosis and monitoring, allowing for use of reflection high-energy election diffraction and other diagnostic methods (including MS and RGA) under the vacuum conditions inherent to such a technique.

It can also be an object of the present invention to integrate metal oxide thin films, such as those described above, and/or related composites thereof to provide for one or more devices, such devices having, without limitation, dielectric, refractory, ferro-electric, electro-optical, non-linear optical, field emission, phosphor/luminophor, optical isolation, photonic, waveguide, MOS, MOSFET, semiconducting, and/or super conducting applications, such devices as can otherwise be fabricated using techniques and components known to those skilled in the art.

In particular, it can also be an object of the invention to provide epitaxial MgO layers on silicon substrates have potential applications in ultra-large scale integration and in microphotonics. Because of the thermodynamic stability of MgO with both silicon and ferroelectric oxide thin films, it can be used as an ideal buffer layer between ferroelectric oxides and Si in optical integrated circuits. Furthermore since its dielectric constant of 9.65 is 3 times larger than $SiO_2$, crystalline thin film MgO is a potential alternative gate dielectric to $SiO_2$ in metal-oxide-semiconductor (MOS) devices and in metal/ferroelectric/insulator/semiconductor field effect transistor devices.

Other objects, features, benefits and advantages of the present invention will be apparent from the following summary, descriptions and examples, and will be readily apparent to those skilled in the art having knowledge of various thin film materials, composites and/or integrated devices. Such objects, features, benefits and advantages will be apparent from the above as taken in conjunction with the accompanying examples, tables, data, incorporated references and all reasonable inferences to be drawn therefrom.

In part, this invention relates to the deposition of thin films by MOMBE using a suitable oxide precursor in a plasma $O_2$ atmosphere. The deposited films have been characterized by Auger electron spectroscopy (AES), scanning electron microscopy (SEM), transmission electron microscopy (TEM) and capacitance-voltage measurements. As described and illustrated below, films with bulk-like dielectric properties are deposited. This technique utilizes solid metal-organic compounds as the metal source. See, J. P. Bade, E. A. Baker, A. I. Kingon, R. F. Davis, and I. Bachmann, J. Vac. Sci. Technol. B, 2, 327(1990); A. L. Kingon, K. Y. Hsieh, L. L. H. King, S. H. Rou, K. J. Bachmann and F. Davis, Mat. Res. Sco. Symp. Proc., 200, 49(1990); D. J. Lichtenwalner, and A. I. Kingon, Appl. Phys. Lett. 59(23), 3045(1991); S. Ikegawa, and Y. Motoi, Thin Solid Films, 281-282, 60(1996); K. Hayama, T. Togun, and M. Ishida, J. Cryst. Growth, 179, 433(1997); and European Patent Appln. 0055459A, publd. Jul. 22, 1997.

Accordingly, the present invention includes a method for deposition of a metal oxide layer on a substrate. The inventive method includes (1) providing a suitable substrate; (2) providing a metal-organic precursor compound; and (3) depositing a film of the metal oxide on the substrate by molecular beam epitaxy deposition. The metal oxide deposited on the substrate is derived from the precursor compound utilized in conjunction with molecular beam epitaxy techniques and equipment of the sort described herein and as would be otherwise well known to those skilled in the art made aware of this invention. The inventive methodology of this invention provides for metal oxide deposition substantially without substrate oxidation.

A variety of oxidants/oxygen sources can be utilized, as would be well known to those skilled in the art. Preferred embodiments of this invention utilize oxygen plasma generated at appropriate energy levels to provide suitable oxygen partial pressures. In preferred embodiments, the method of this invention includes such partial pressures less than about $10^{-3}$ Torr. As described elsewhere herein, depending upon choice of substrate and other system parameters suitable oxygen partial pressures can be less than about $10^{-5}$–$10^{-6}$ Torr. Regardless, the growth of oxide thin films is observed without substrate oxidation.

With regard to the aforementioned metal-organic precursor compounds, the metal component thereof can include, but is not limited to, Ca, Zn, Cd, V, Rh, Pt, Th, Fe, Pd, Ga, Al, Be, U, Hf, La, Pr, Sm, Gd, Dy, Er, Yb, Sc, Th, Ti, Ba, Ce, Mg and Pb. The ligands used in conjunction with such metal components are as described herein or as can provide the precursor compound sufficient volatility and/or decomposition properties for use in such deposition techniques. Various such ligands can include those derived from straight-forward modifications and extensions of the work described herein, and/or through routine experimentation by those skilled in the art made aware of this invention. The precursor compounds of this invention can have, under deposition conditions described, a partial pressure of less than about $10^{-3}$–$10^{-4}$ Torr.

Regardless, preferred embodiments of the present methodology include such precursor compounds which provide for the deposition of refractory metal oxides and/or reactive metal oxides, depending upon end use application and specific properties required of the resulting film. Such films can be amorphous or provided with glass, crystalline, polycrystalline and/or epitaxial morphologies. In preferred embodiments, such films are crystalline and stoichiometric, such as the magnesium oxide thin film characterized herein.

As described more fully below, control of substrate temperature can be part of the inventive methodology. Generally, such a substrate can be heated to a temperature of less than about 1000° C. For many composites and/or end use applications, a preferred substrate is silicon, which can be heated to a temperature of between about 500° C. and 1000° C. Other such substrates can comprise other Group IV elements, various transition metals and semi-conductor materials. Compound substrates are also contemplated in conjunction with this invention. Regardless, an appropriate substrate temperature can be determined and/or adjusted with consideration of various other factors described herein, including but not limited to substrate identity and/or oxygen partial pressure.

In preferred embodiments, the present method also includes formation of a carbide layer on the substrate, prior to deposition of a metal oxide film. Typically, a metal-organic precursor compound, of the type described above, is likewise a precursor for the carbide layer, such formation the result of substrate exposure to the precursor absent an.

oxygen source. Such carbide layers are preferably formed with a silicon substrate, but can also be formed in conjunction with other substrate materials, including transition metals and semi-conductors. In such embodiments, the carbide layer can be epitaxial with respect to the substrate, and as would be desired for subsequent deposition of an epitaxial metal oxide. Even so, non-epitaxial carbide layers can be formed and utilized as needed, e.g.—for substrate oxidation resistance.

While MOMBE has been used to deposit compound semi-conductor layers, it has not been utilized to any significant degree for the deposition/growth of oxide films. A major advantage of MOMBE methods described herein, is that the $O_2$ pressure is very low ($<10^{-6}$ Torr) compared to prior art techniques ($\sim 10^{-3}$ Torr), which can enable the growth of oxide thin films directly on Si without formation of an amorphous $SiO_2$ interfacial layer, a condition which inhibits epitaxial coverage. Furthermore, the technique can be scaled to large area substrates. The high vacuum also enables in situ surface diagnosis such as reflection high-energy electron diffraction (RHEED), a diagnosis which is not possible with MOCVD and other techniques of the prior art. This invention can be extended to include deposition and use of a wide variety of refractory and reactive metal oxides, using available metal-organic precursors.

Thin dielectric films, including but not limited to MgO, deposited on Si and such substrates are of considerable technological importance. For example they can be used as an optical isolation layer for ferroelectric oxide waveguide on Si. See, U.S. Pat. No. 5,776,621, in particular FIG. 1 and cols. 3–8 thereof, the entirety of which is incorporated herein by reference. They can also be used as a gate oxide in MOS devices; R. A. Mckee, F. J. Walker and M. F. Chisholm, Phys. Rev. Letts., 81(14), 3014(1998) or they can serve as a buffer between other oxides and Si wafer where the integration of these materials with such a substrate is required; K. J. Hubbard and D. G. Schlom, J. Mater. Res., 11(11), 2757(1996).

Accordingly, the present invention also includes a composite comprising a substrate and a metal oxide film thereon. The composite is substantially absent substrate oxidation, and the oxide film is substantially without carbon contamination. The film is produced by metal-organic molecular beam epitaxy deposition, such deposition conducted under oxygen partial pressures less than about $10^{-3}$ Torr. The substrate temperature can be as required to preclude oxidation thereof, with consideration of partial oxygen pressure. However, at pressures of the type described herein, the substrate temperature is typically less than about 1000° C.

The film component of such a composite can comprise the oxide of a metal of the type described above, or as could otherwise be provided by a corresponding metal-organic precursor compound. In preferred embodiments and depending upon end use application, the metal oxide is selected from a group consisting of refractory metal oxides and reactive metal oxides. As described herein, thin films of such refractory metal oxides can exhibit bulk dielectric properties.

The film component of the present composites can have, as described above, various morphologies. In preferred embodiments, such a film is epitaxial, and can be utilized for subsequent deposition of other functional materials, such as various super conducting or semi-conducting materials. As such, the composites of this invention can further include a carbide layer between the substrate and the metal oxide film. While the carbide layer can be non-epitaxial, epitaxy is preferred with respect to subsequent oxide deposition, phase-pure crystallinity, bulk dielectric properties and/or use of such composites/oxides in conjunction with various integrated devices. As described elsewhere herein, the carbide interlayer can be the carbonization product of the substrate and a suitable metal-organic precursor compound, such carbonization resulting from treatment of a precursor compound under molecular beam epitaxy conditions absent the presence of oxygen.

The use of epitaxial, uniform functional oxide thin films on various substrates, such films and substrates including those described herein, can also be used in conjunction with deposition of high crystalline quality, epitaxial high-temperature-superconducting (HTSC) oxides. For instance, an HTSC oxide film can subsequently be epitaxially deposited on an insulated substrate structure using any of the existing growth techniques currently used for single crystal MgO substrates. As a result, wafers of Si coated with MgO can be marketed to researchers growing such ferroelectric or superconducting films, as a replacement for single crystal oxide substrates.

Other integrated elements, composites and/or devices can be prepared in accordance with this invention using fabrication techniques otherwise known in the art and modified as provided herein, such elements, composites and devices including but not limited to those described in U.S. Pat. Nos. 5,418,216, 5,830,270 (in particular, FIGS. 5 and 6 and the descriptions thereof), U.S. Pat. Nos. 5,482,003 and 5,323,023—all of which are incorporated herein by reference in their entirety.

BRIEF DESCRIPTION OF THE DRAWINGS

FIGS. 23(a)–(b) show AFM micrographs, of the SiC interlayer of Example 22, taken in the (a) height mode, and (b) deflection mode.

EXAMPLES OF THE INVENTION

The following examples demonstrate deposition of crystalline or epitaxial oxide thin films by metal-organic molecular beam epitaxy using suitable precursors. MgO, films, representative and illustrative of the films available through this invention, were deposited using the bis-tetramethylheptanedionate or bis-acetylacetonate precursors (Examples 3b and 9–13, for the later) and an RF oxygen plasma. AES analysis indicated the deposited films were MgO. The films were phase pure and crystalline (or epitaxial) as determined by transmission electron microscopy. Other morphologies are available, as desired, by modification of deposition conditions, as described herein. Carbon contamination of the films was negligible. The films have bulk-like dielectric properties. These results indicate that MOMBE shows utility for the large area deposition of thin oxide films. While the utility of this invention is demonstrated with the preparation, use and/or integration of magnesium oxide films and silicon substrates, it will be understood by those skilled in the art and made aware of this invention that other films from other metal precursors can be prepared and/or used with comparable effect with other substrates enroute to the fabrication of a variety of integrated devices.

The film thickness was measured by a Tencor P-10 surface profiler. The film composition was measured by Auger electron spectroscopy (AES) using a Physical Electronics scanning Auger microscope. The microstructure was determined by a Hitachi HF-2000 cold field emission high resolution transmission electron microscope (TEM) operated at 200 kV. TEM samples were prepared by mechanical grinding and polishing, followed by further thinning in a Gatan Model 691 precision ion polishing system. A Hitachi S-4500 cold field emission and high resolution scanning electron microscope (SEM) was also used to examine the film surface morphology and cross section. Alternatively, the surface morphology and roughness of the films can be measured with a Nanoscope III atomic force microscope (AFM) with a $Si_3N_4$ tip.

Example 1

Figure 1:
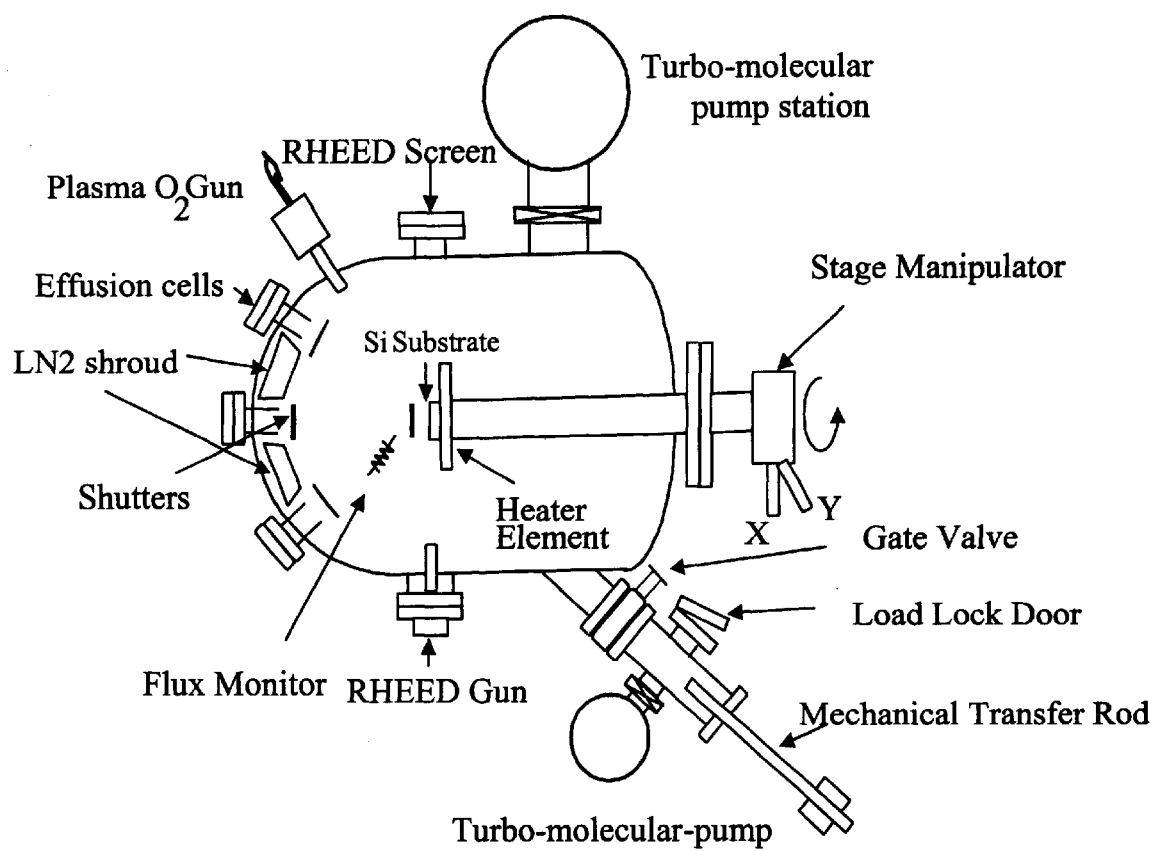
FIG. 1 is a schematic representation of a molecular beam epitaxy system of the type which can be used in conjunction with this invention.

The films can be deposited in a commercially-available SVT Associates SN35 MBE system equipped with low temperature effusion cells and an oxygen plasma source. See. FIG. 1. The solid metal-organic precursor can be contained in an effusion cell. The cell temperature can be precisely controlled to within 0.2° C. Without limitation, $Mg(thd)_2$ (thd=tetramethylheptanedionate) and $Mg(acac)_2$ (acac=acetylacetonate) can be used as precursors. The source flux is measured with a flux monitor. An oxygen plasma from a SVT RF plasma $O_2$ source with an output energy of 300–400 W can be used as an oxidant. For $Mc(thd)_2$, the growth temperature was 700° C. The substrate temperature was measured by a thermocouple calibrated by an infrared optical pyrometer. Table 1 provides ,conditions for deposition of the MgO film by MOMBE.

TABLE 1

| | |
|---|---|
| Substrate | (100) Si |
| Growth temperature(° C.) | 700 |
| Plasma $O_2$ pressure (Torr) | $1.0 \times 10^{-5}$ |
| Pressure of Source $Mg(thd)_2$(Torr) | $1.0 \times 10^{-5}$ |
| Deposition time (hour) | 1–4 |
| Deposition rate (nm/h) | 100 |

Alternatively, deposition can be conducted at $10^{-5}$ Torr of oxygen with a substrate temperature of 500–850° C. Under such alternate conditions, films with thickness ranging from 20 to 200 nm were deposited at a growth rate of 15–50 nm per hour.

Example 2

N-doped Si (100) wafers, 3 inches in diameter, with a resistivity of 1–10 Ωcm were used as substrates. Prior to growth, the Si substrate was chemically etched in a $HNO_3$:$BF$:$H_2O$(5:3:92 by volume percentage) solution for several seconds to remove the surface oxide layer and then was cleaned in methanol and acetone for 15 minutes each. The chemically etched Si wafer was then immediately placed in the system load lock and transferred to the growth chamber. The base pressure of the chamber was $10^{-9}$ to $10^{-10}$ Torr. The Si was subsequently degassed in-situ for 30 minutes at 200° C. and for 30 minutes at 850° C. The Si surface cleaned by this simple recipe usually showed a clear and streaky RHEED pattern with Kikuchi lines indicating the Si surface was atomically clean.

Example 3a

Figure 2A:
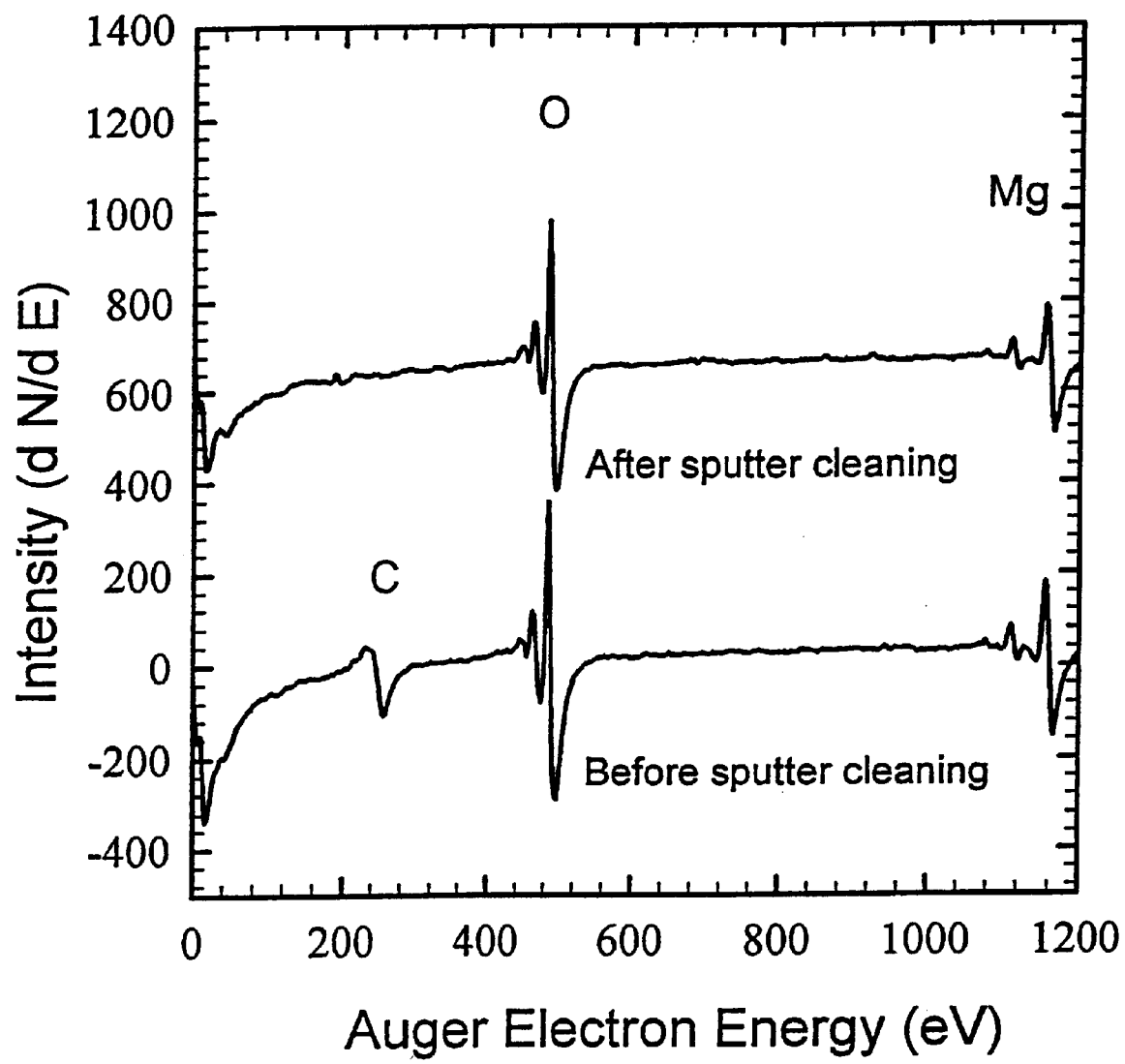
FIGS. 2(a) and 2(b) show Auger electron spectra characterizing a MgO film surface.

FIG. 2(a) shows a typical Auger spectra from the surface of a film deposited at 700° C. for 4 hours. The bottom curve shows the spectra for a film surface prior to sputter etching. The peaks are attributed to Mg, O and C, respectively. After the film surface was sputter etched with $Ar^+$ ions for 3 minutes, the Mg and O peaks remain with no apparent change in intensities indicating the films were MgO. The C peak, however, disappeared after sputtering which indicates that it resulted from film surface contamination. Most importantly, carbon incorporation from the source material was not apparent in the oxide film.

Example 3b

Figure 2B:
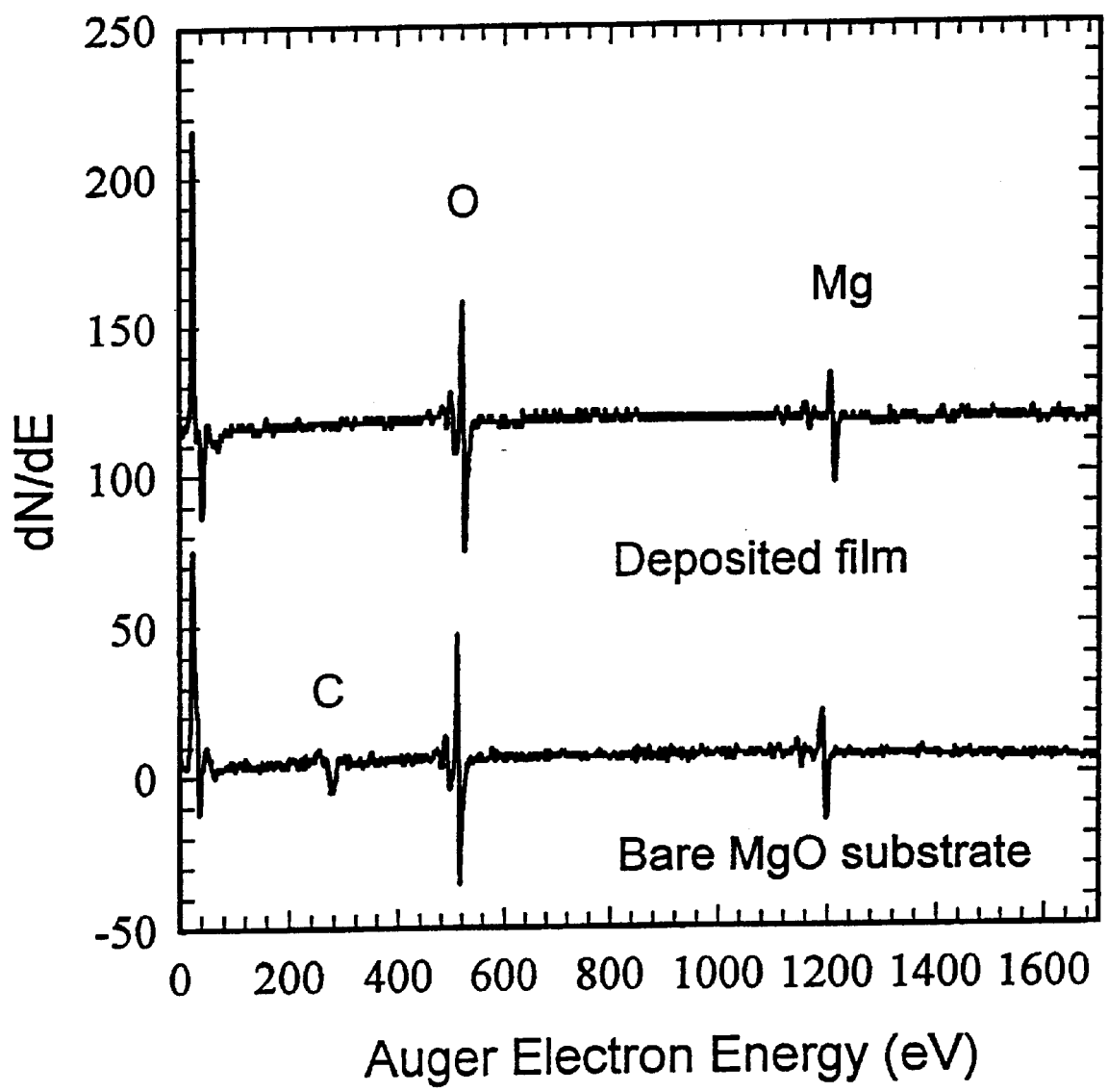

Another film was deposited and was shown to be uniform and mirror smooth over the entire three inch wafer. The chemical composition of the films was again analyzed by AES. FIG. 2(b) shows an Auger electron spectra from a film grown at 700° C. after sputter etching. Only the Mg and O peaks are observed. No trace of carbon contamination of the thin film was observed within the detection limit of AES. For comparison the Auger spectrum of a MgO substrate is also shown. The peak intensities are comparable for both the film and the substrate, indicating the films are stoichiometric.

Example 4

MgO films prepared, as described above, had mirror like surfaces as confirmed by optical microscopy. A columnar morphology, however, Was observed by SEM with the island sizes ranging from 10 to 50 nm as shown in FIG. 2a. FIG. 2b shows a cross section SEM micrograph from a cleaved edge of the film, where the columnar structure is clearly shown. The film has a thickness of 400 nm.

Example 5

Figure 3:
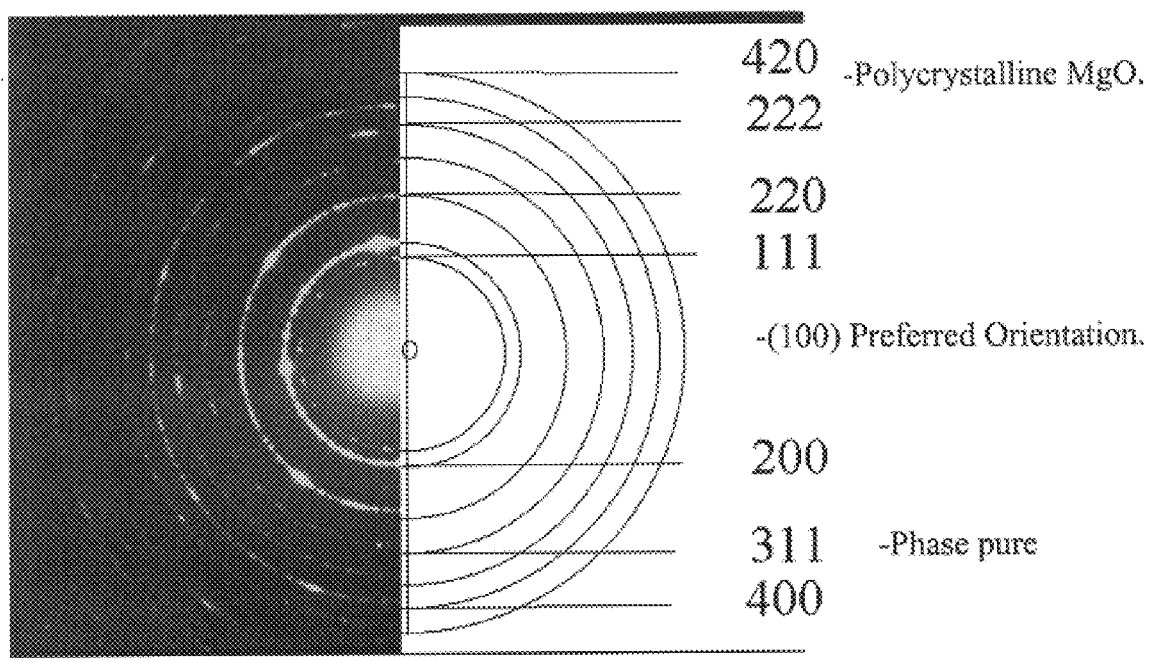
FIG. 3 shows electron diffraction pattern from a MgO film; all rings are indexed to polycrystalline MgO.

To determine the structure of the film, TEM was performed. FIG. 3 shows a TEM diffraction pattern from the film. A ring diffraction pattern was observed which indicates that the films are crystalline. The rings were attributed to electron diffraction from polycrystalline MgO. Table 2, below, lists the measured d spacing and relative intensities together with JCPDS data of MgO. A good match between the data and pattern can be seen. No diffraction from any other phases are observed, thus the films are phase pure MgO. In addition, some extra diffraction spots are observed superimposed on the ring diffraction pattern, which are indexed to the MgO <001> diffraction pattern. This indicates that the MgO films are partially textured. A bright field micrograph of MgO showed crystallites. The MgO crystallites are on the order of ten nanometers in size and had an irregular shape.

TABLE 2

Identification of the polycrystalline MgO electron diffraction patterns.

| Experimental | | JCPDS file of MgO | | |
|---|---|---|---|---|
| d spacing (Å) | Relative Intensity (%) | d spacing (Å) | Relative Intensity (%) | hkl |
| 2.452 | 30 | 2.431 | 10 | 111 |
| 2.102 | 100 | 2.106 | 100 | 200 |
| 1.491 | 80 | 1.489 | 52 | 220 |
| 1.268 | 20 | 1.270 | 4 | 311 |
| 1.209 | 50 | 1.216 | 12 | 222 |
| 1.051 | 30 | 1.053 | 5 | 400 |
| 0.939 | 40 | 0.942 | 17 | 420 |
| 0.870 | 30 | 0.860 | 15 | 422 |
| 0.817 | 10 | 0.811 | 3 | 511 |

Example 6

As a point of comparison, a high resolution TEM micrograph was obtained of the interfacial region between one deposited film and Si substrate. A thin amorphous layer less than 5 nm in thickness was observed. The amorphous interfacial layer was most likely silicon dioxide. It presumably results from oxidation of the surface of the Si substrate by the Mg $(thd)_2$ or its decomposition products during the initial growth of MgO layer. The presence of an amorphous layer results in the growth of polycrystalline MgO rather than formation of epitaxial single crystal MgO.

As provided elsewhere herein, amorphous materials can be prepared by modification of the methods and/or techniques described herein. Such materials are desirable for a number of integrated devices, for instance those where a high dielectric constant is required. As an example, amorphous films of rare earth doped silicates can provide the high dielectric constant needed for certain integrated devices and/or applications.

Example 7

Figure 4:
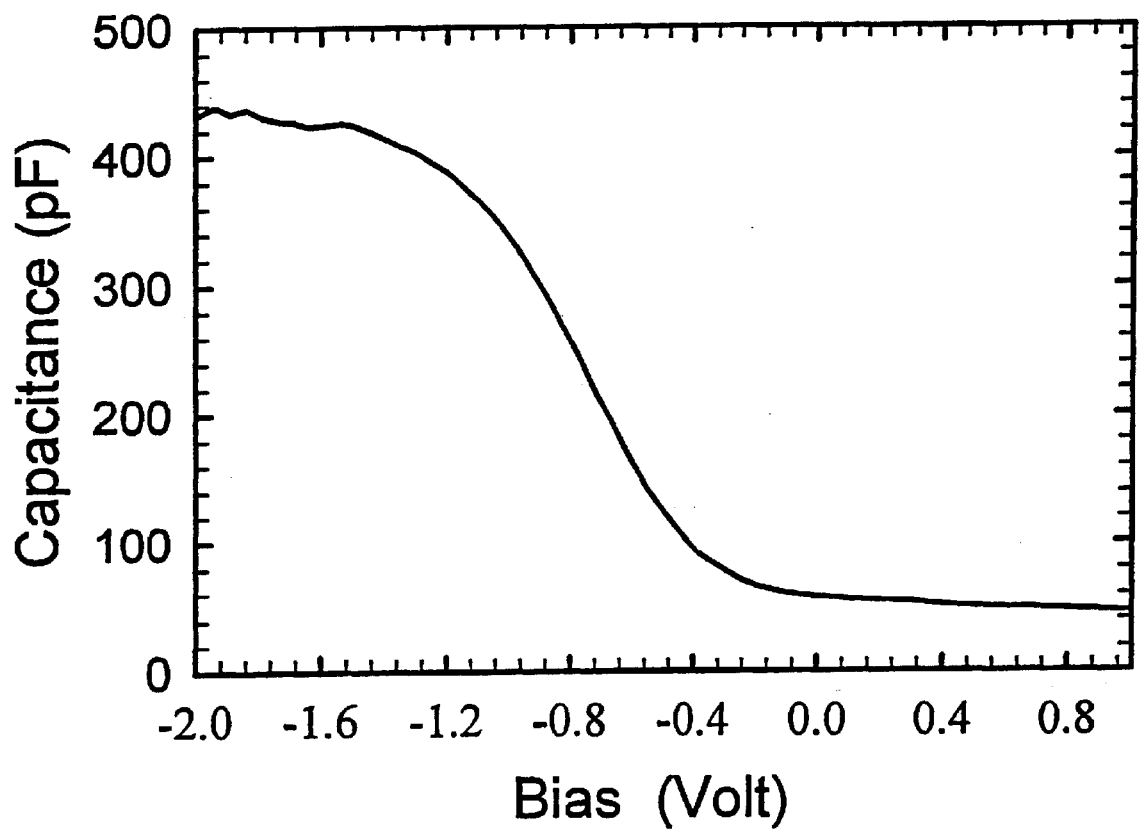
FIG. 4 shows capacitance-voltage curve at 100 kHz for the Au/Cr/MgO/Si structure, of Example 7.

To determine the dielectric constant of the films, capacitance-voltage measurements were performed on a metal-oxide-semiconductor (MOS) structure utilizing the MgO film as the oxide insulating layer. Contact was made to the oxide film surface by evaporation of 500 μm diameter dots consisting of a thin Cr adhesion layer covered with Au. Contact to the backside of the Si was made by indium soldering. An HP4192A impedance analyzer was used to measure C-V curves. For the Au/Cr/MgO/Si structure representative data taken at 100 kHz at room temperature is shown in FIG. 4 for a film with a nominal thickness of 40 nm. The C-V measurement indicates metal-insulator-semiconductor behavior. The dielectric constant of the films was calculated from the maximum value of the capacitance under accumulation conditions. The average value of the dielectric constant of these MgO films was 10.5, which is comparable to the bulk value of 9.6 within experimental error.

Example 8

The device of example 7, while constructed to demonstrate dielectric/insulting function, can be modified as described or referenced elsewhere herein to provide integrated devices for a wide range of functional applications, such other applications as would be known to those skilled in the art and made aware of this invention. For instance, thin film electrooptical and/or optical waveguide structures can be integrated therewith.

Example 9

Figure 5A:
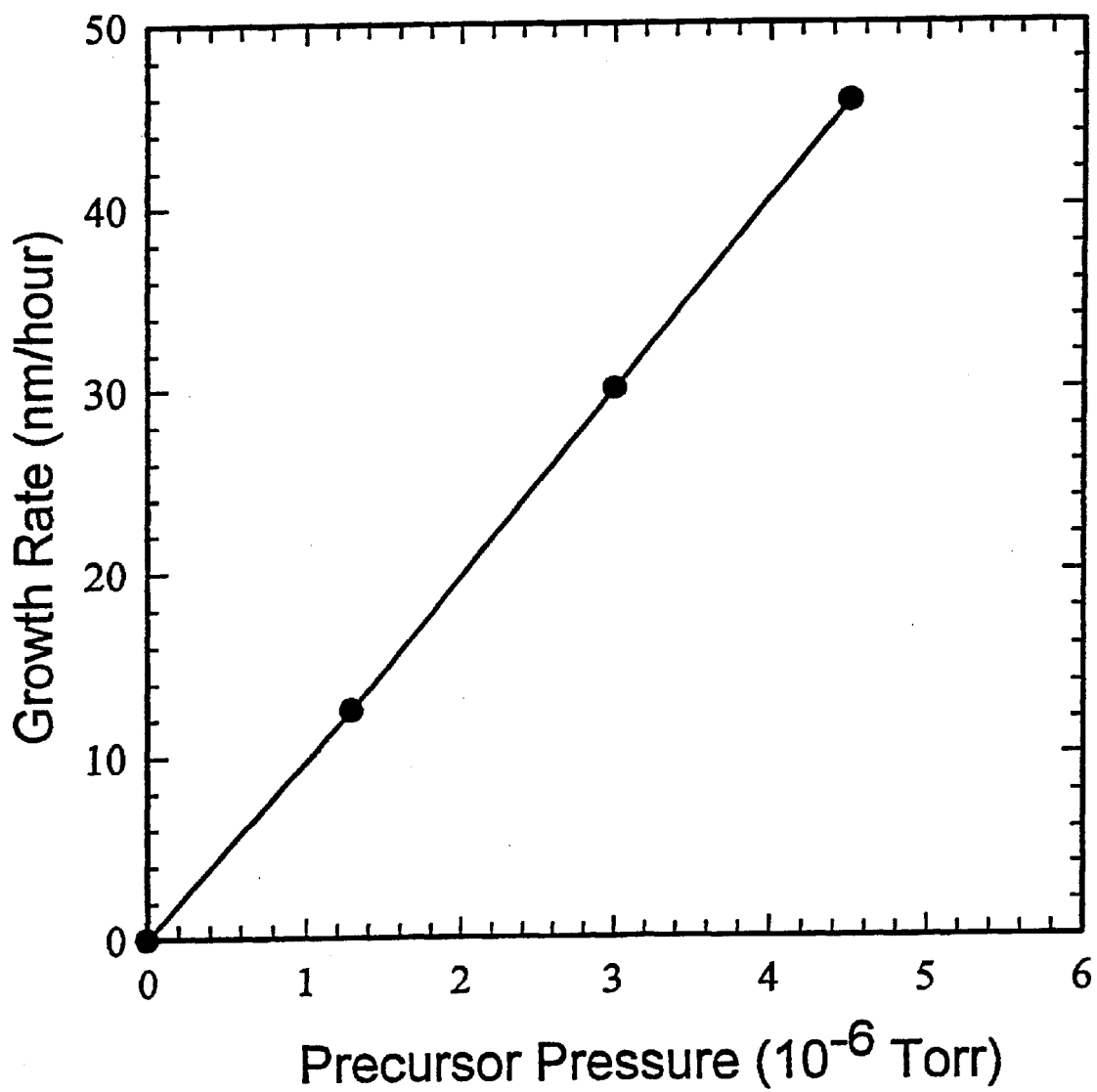
FIG. 5(a) shows film thickness as a function of growth time, using the growth of an MgO film as a representative example in accordance with this invention.
Figure 5B:
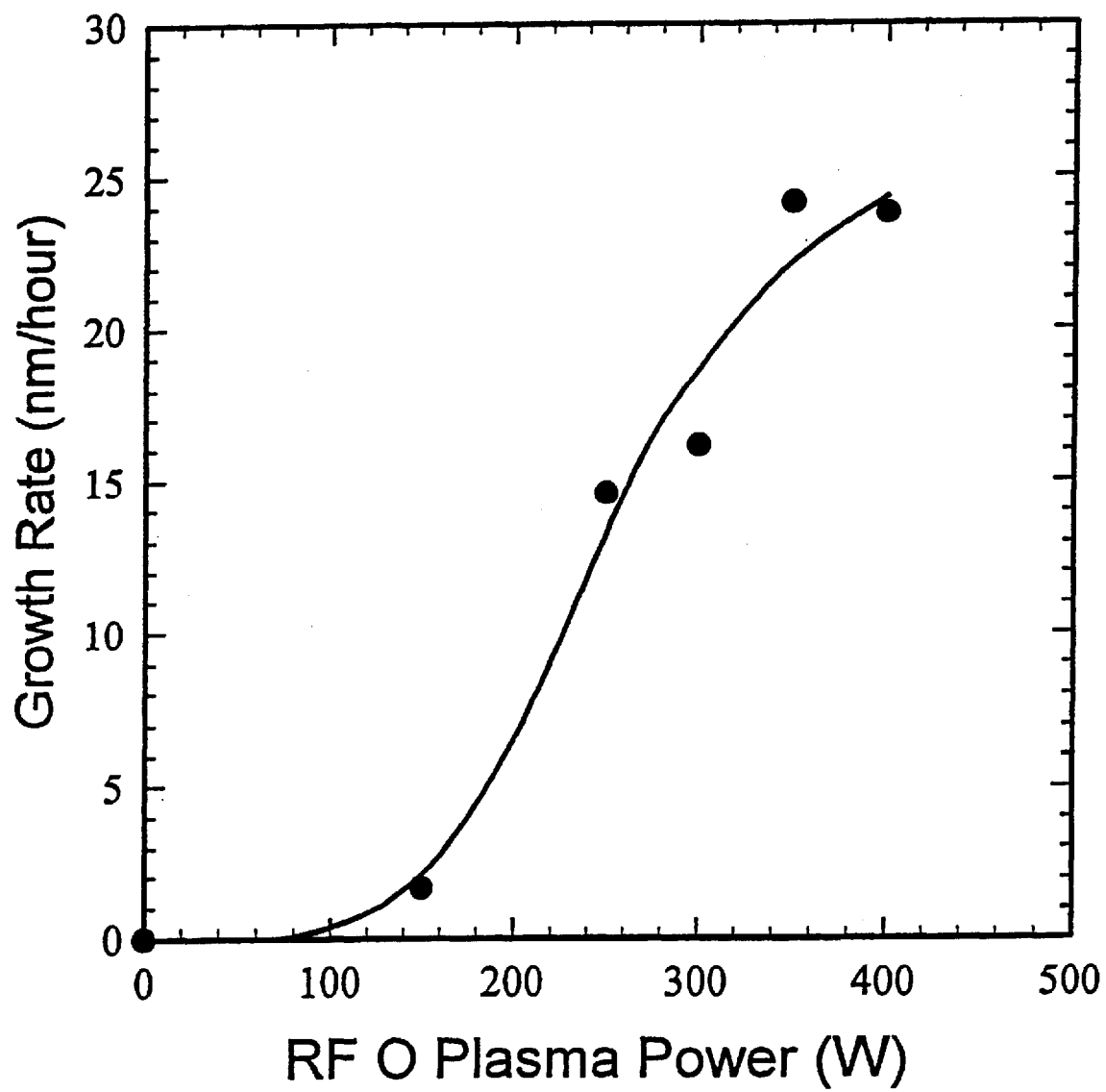
FIG. 5(b) shows film thickness as a function of $O_2$ plasma power, at 700° C. and a source pressure of $10^{-6}$ Torr.

The film thickness as a function of growth time was measured for a series of five samples grown at 700° C. Film thickness ranged from 7 to 45 nm. A constant growth rate of 15 nm/hour was noted as shown in FIG. 5(a). The result indicates that the precursor flux is quite stable during growth. The effect of RF $O_2$ plasma power on deposition rate was also studied. FIG. 5(b) shows film thickness as a function of the RF $O_2$ plasma power. With only molecular $O_2$ no M90 film was deposited. As the RF power increased, the growth rate increased superlinearly. At 250 Watts the growth rate increased to 45 nm/hour. A maximum growth rate of 70 nm/hour was obtained at an RF power of 350 W.

Example 10

Figure 6:
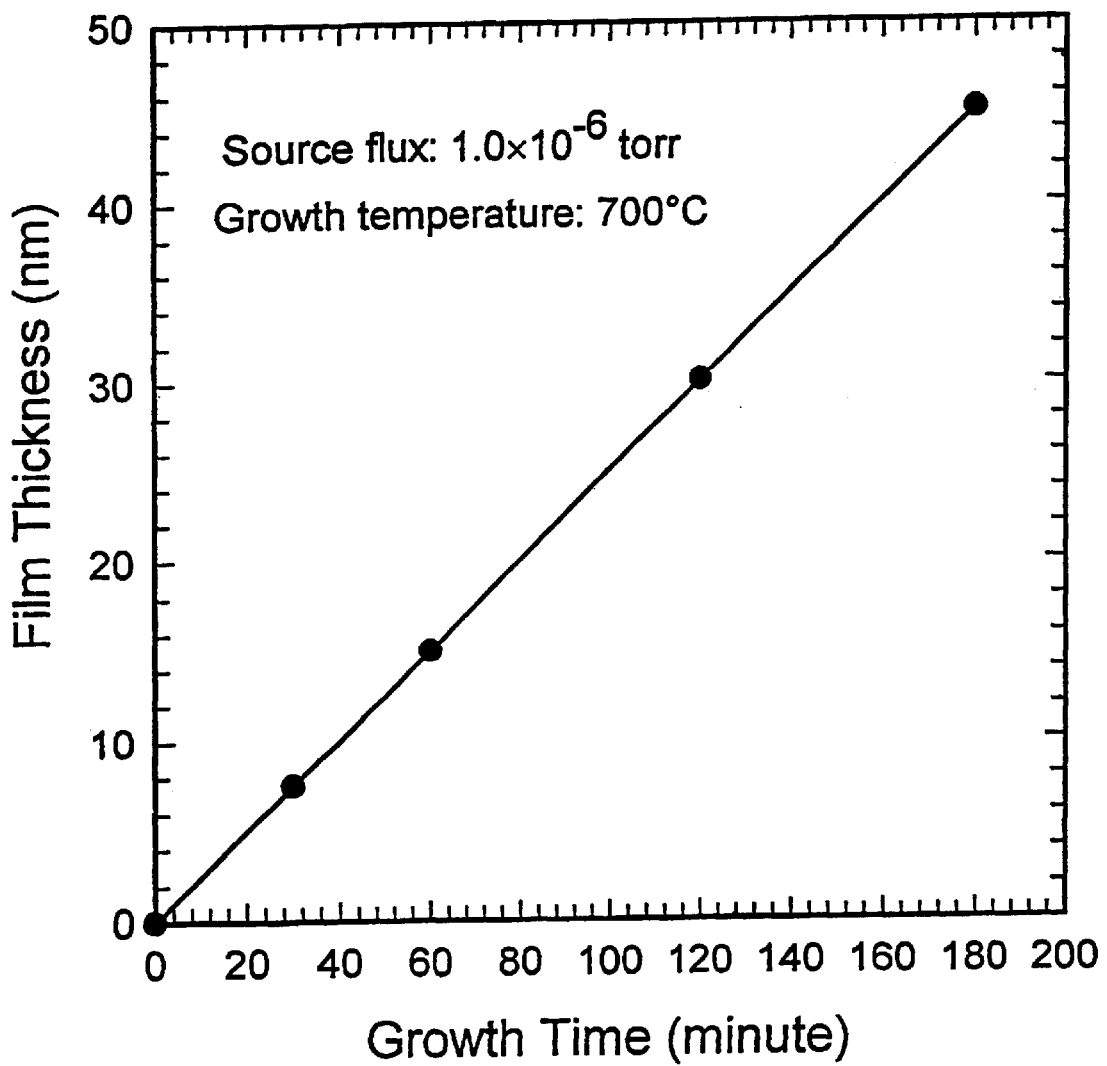
FIG. 6 shows deposition/growth rate of a thin film of this invention as a function of the source/precursor partial pressure.

FIG. 6 shows the growth rate as a function of Mg source partial pressure. A linear dependence of growth rate on precursor partial pressure is observed for an oxygen partial pressure of $10^{-5}$ Torr. Since the films are always grown under excess oxygen, the deposition rate is determined by the Mg source partial pressure.

Example 11

Figure 7:
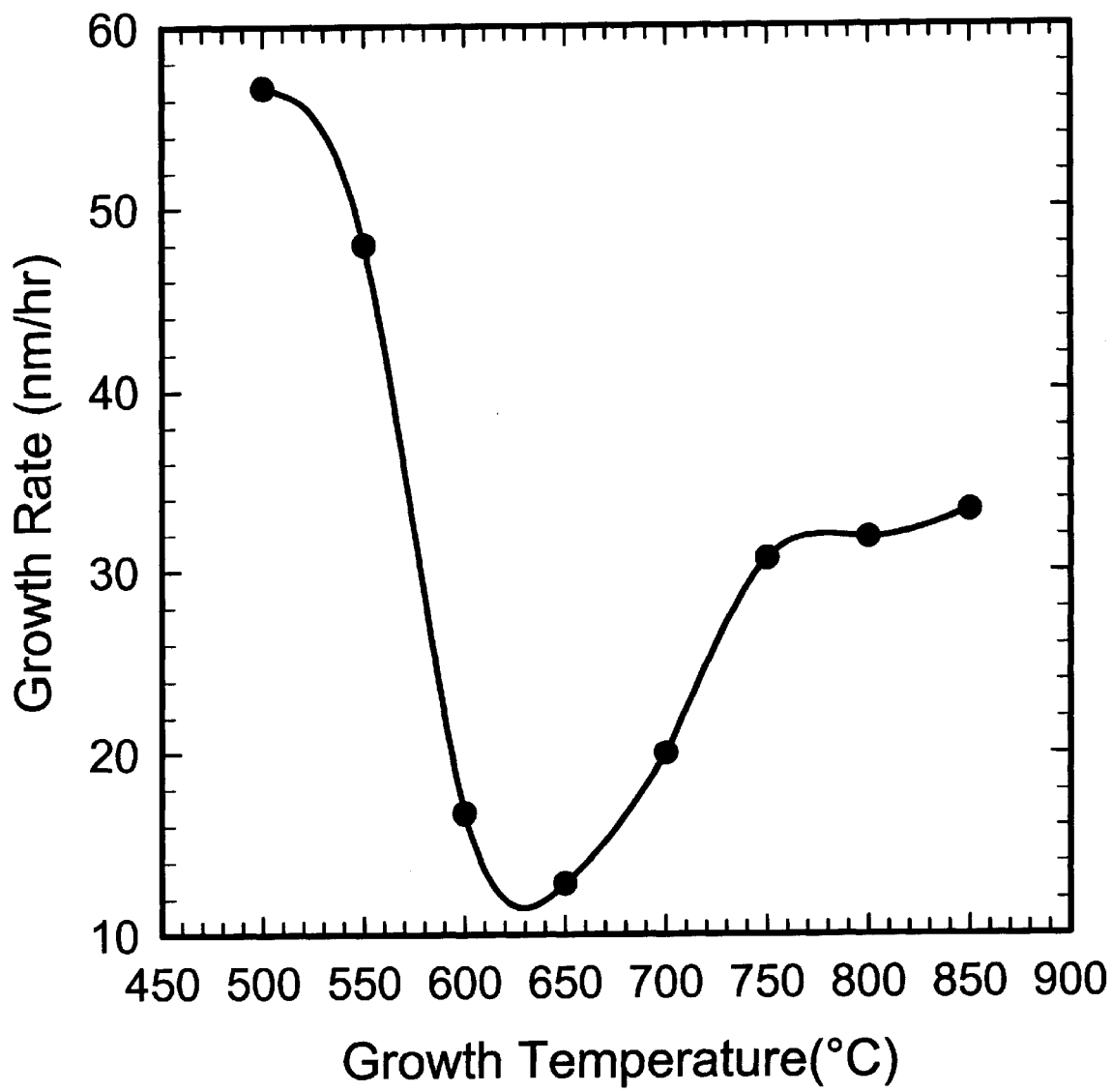
FIG. 7 illustrates film growth rate as a function of growth temperature.
Figure 8:
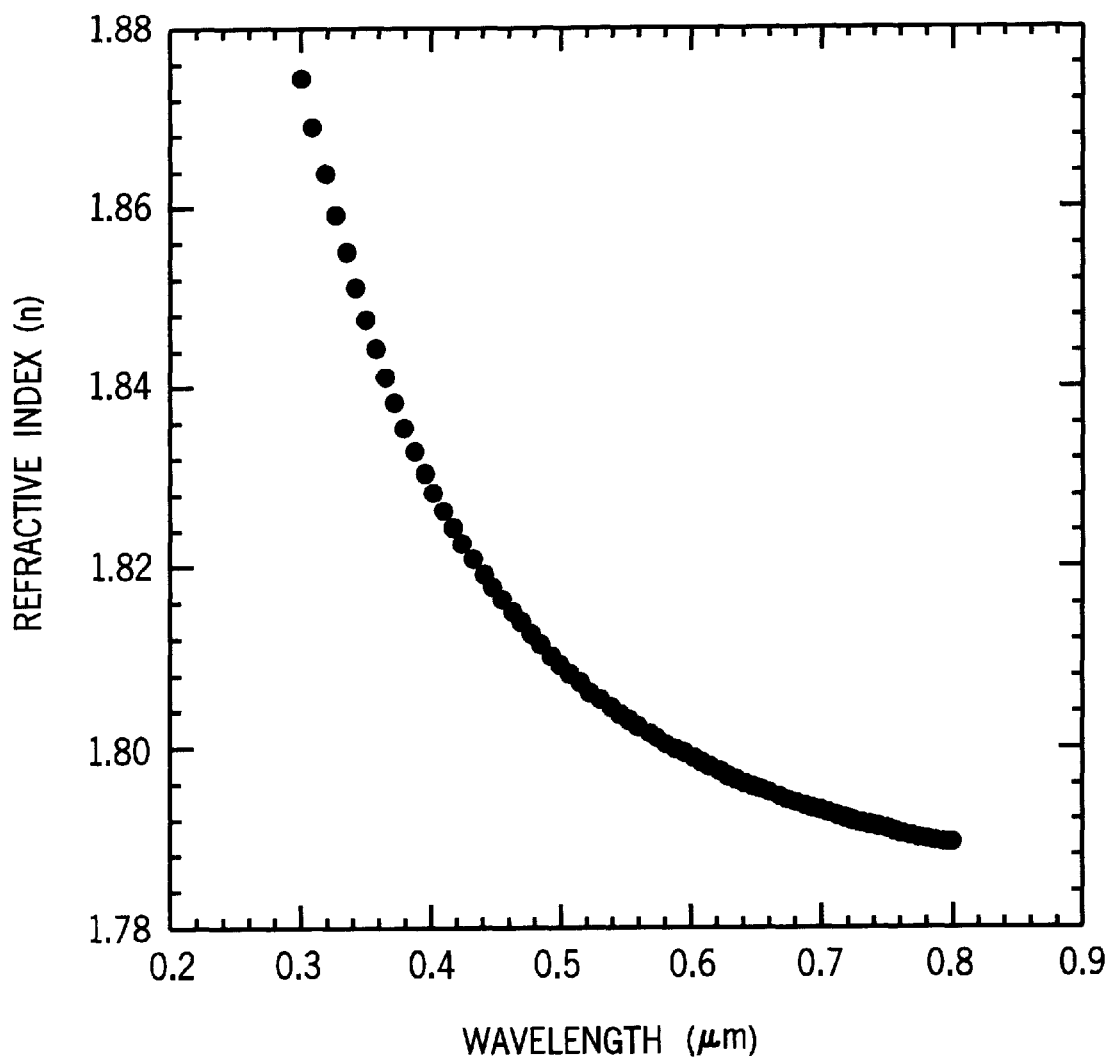
FIG. 8 shows retractive index measurements, by ellipsometry, taken from a 70 nm MgO thin film, in accordance with the materials, composites and devices of this invention.

The effects of the growth temperature (over the range from 500° C. to 850° C.) on growth rate, surface roughness and morphology of oxide thin films have been investigated. The growth conditions were kept the same except for the growth temperature, with the precursor pressure at $1.0\times10^{-6}$ Torr, plasma oxygen pressure at $1.0\times10^{-5}$ Torr and growth time of 3 hours. Using a magnesium precursor, it was found that RHEED patterns from the films deposited at all the temperatures showed ring feature which indicates that polycrystalline MgO films could be grown over the whole temperature range. However, RHEED pattern consisting of both rings and spots only appeared at 650° C. and 700° C., indicating that textured MgO thin films were grown in this temperature range. FIG. 7 shows the growth rate as a function of the growth temperature. At growth temperatures above 650° C., the growth rate increased with increasing growth temperature from about 12 nm/hr at 650° C. to about 33 nm/hr at 850° C. while below 650° C. the growth rate increased with decreasing growth temperature up to about 56 nm/hr at 500°. This complex temperature dependence indicates that there are possible two different growth mechanisms dominant in the temperature ranges below and above 650° C. According to the classic kinetics of surface reactions and physisorption and chemisorption, the growth rate of MgO films should be governed by a balance of the chemsorption rate (Rc) and re-evaporation rate (Re) of MgO on Si surface. The chemisorption may be defined as Mg (acac)$_2$ is decomposed on Si surface at a growth temperature Ts and then react with surface oxygen coming from the O plasma gun to form MgO molecules even though the surface reaction detail is still unknown so far. The chemisorption reaction rate should increase with increasing $T_s$ as described by the classic kinetics of surface reaction. On the other hand, the re-evaporation rate of MgO should decrease with increasing Ts. The balance of these two relations possible determines the complex temperature dependence of the MgO growth rate, namely, at Ts>650, Rc is dominant while at $T_s$<650° C., Re is dominant.

Example 12

Figure 9:
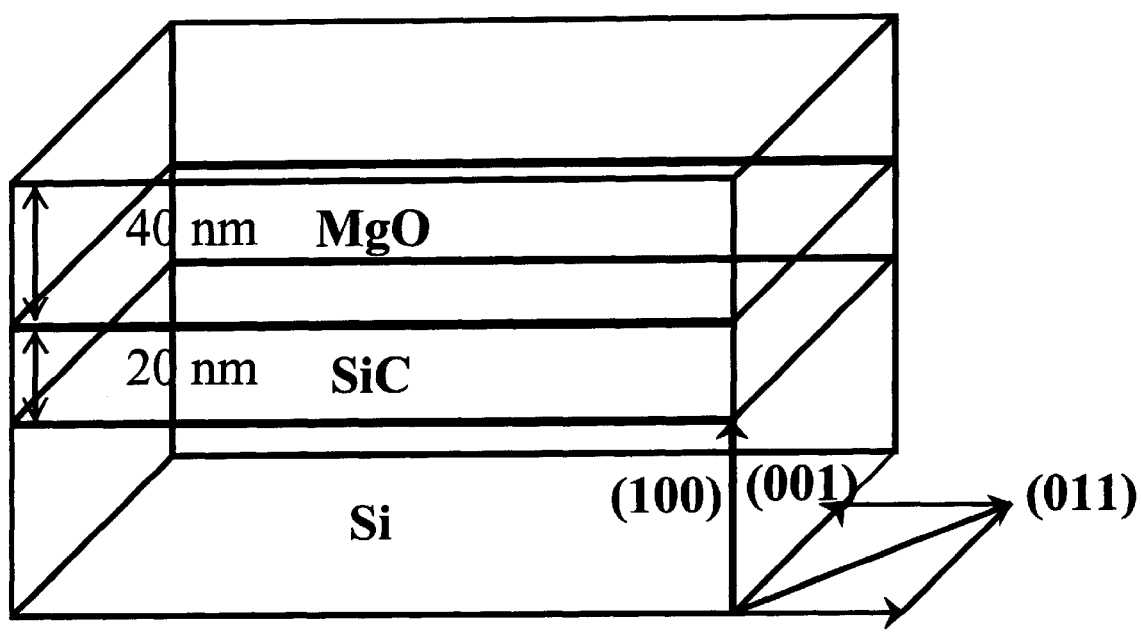
FIG. 9 is a schematic diagram of a composite MgO/SiC/Si structure, a composite in part illustrative of the present invention.

In addition to polycrystalline thin films, the present invention can be extended to provide epitaxial films. For instance, epitaxial MgO on 3 inch diameter Si wafers using an intermediate epitaxial layer of silicon carbide (SiC) produced by metalorganic molecular beam epitaxy. This technique requires only nominal composition and thickness control of the deposited species, greatly simplifying the deposition process. The SiC interlayer is formed by decomposition of a metalorganic source. See, FIG. 1. The composite MgO/SiC/Si structure (FIG. 9) was grown with a single metalorganic precursor, Mg(acac)$_2$, which served as the source of both carbon and magnesium in the system. An RF oxygen plasma provided the oxygen necessary for growth of the MgO films. Growth conditions for the SiC and MgO layers are listed in Table 3.

TABLE 3

|  | SiC | MgO |
| --- | --- | --- |
| Substrate Temperature (° C.) | 900 | 800 |
| Metalorganic Flux (Torr) | $1 \times 10^{-7}$ | $1 \times 10^{-6}$ |
| Oxygen flux (Torr) | 0 | $3 \times 10^{-5}$ |
| RF Plasma Power (W) | 0 | 400 |
| Growth Rate (nm/h) | 30 | 20 |

Example 13

A method for growth of a MgO/SiC/Si structure can include, for example, in various combinations, the following:

Substrate Preparation
1. The (100) Si substrate is etched to remove the native oxide and degreased.
2. The Si is placed in the load-lock, evacuated, and transferred to the main chamber.
3. The Si is then degassed at 200° C. and heated to 850° C. to remove any remaining oxide.

SiC Interlayer Deposition
4. The metalorganic effusion cell is heated until it provides a steady flux Of $10^{-7}$ Torr.
5. The Si substrate temperature is increased to 900° C.
6. The shutter over the Si is opened for 30 minutes while the metalorgaric remains shuttered.

This step results in the epitaxial growth of 15 nm of SiC on the Si. A lower C flux can also be achieved with a lower metalorganic flux.

MgO Deposition
7. The SiC/Si is shuttered while the substrate temperature is lowered to 800° C.
8. The metalorganic source flux is increased to $10^{-6}$ Torr.
9. Both the shutter over the SiC/Si and the shutter over the metalorganic source are opened.
10. The RF plasma oxygen source is started at a pressure of $3\times10^{-5}$ Torr and 400 Watts.
11. Deposition proceeds under these conditions resulting in the growth of an epitaxial (100) MgO film at a rate of ~20 nm/h.

Example 14

The films resulting from the method of example 13 have been analyzed chemically and structurally. During deposition, the structural evolution of the film is monitored using reflection high energy electron diffraction (RHEED). Three distinct RHEED patterns are observed during the growth, corresponding to the epitaxial Si, SiC, and MgO layers. RHEED patterns are available for each layer. Transmission electron diffraction (TEM) confirmed that each of the layers are epitaxially oriented in the (100) direction. The TEM diffraction pattern from the composite MgO/SiC/Si structure has been obtained. Analysis of the layers using Fourier-transform infrared spectroscopy and ellipsometry show optical properties similar to bulk materials.

Example 15

Figure 10:
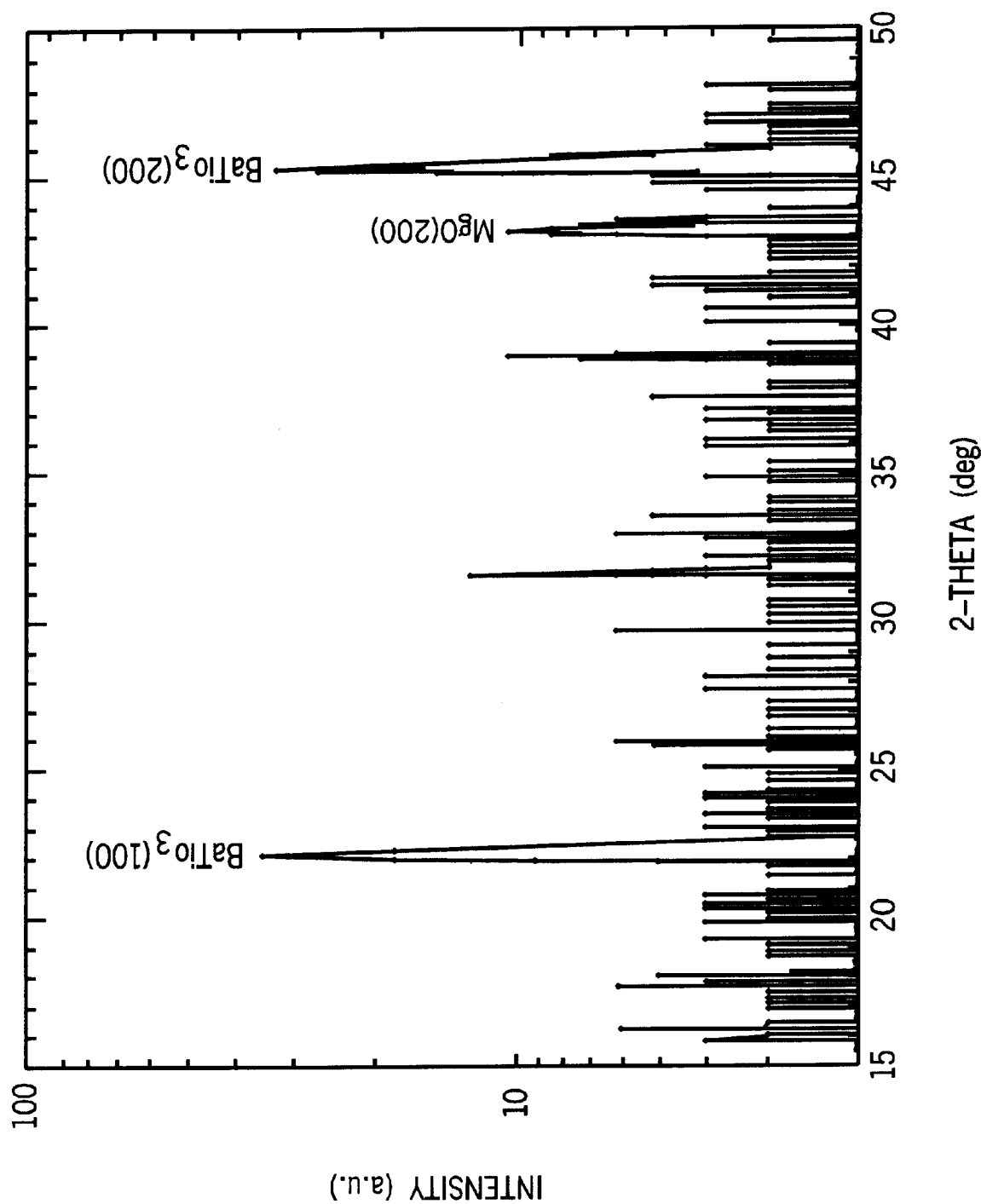
FIG. 10 shows an x-ray diffraction pattern for a $BaTiO_3$ film deposited on a MgO layer grown on a silicon substrate.

As described elsewhere herein, oxide thin films of the type referenced above and as can be provided using the methods and techniques of this invention, can be used on or in conjunction with a substrate to provide a capping or buffer function. With reference to FIG. 10, a textured barium titanate film (~200 nm) was deposited (metal organic chemical vapor. deposition) on a layer of MgO grown on a silicon substrate. The present invention can be extended to the integration of other such ferroelectric thin films to provide the corresponding elements/devices, such films, elements and/or devices including those described more fully in the aforementioned U.S. Pat. No. 5,776,261. Other oxide layers or buffers of this invention can be used with comparable effect.

With reference to Examples 16–19, below, epitaxial cubic MgO thin films were deposited as described on single crystal Si (001) substrates by metalorganic molecular beam epitaxy (MOMBE) using solid precursor magnesium acetylacetonate as the source and an RF excited oxygen plasma as the oxidant—by way of illustrating other aspects of this invention. The growth process involved initial formation of an epitaxial β-SiC interlayer followed by direct deposition of a MgO overlayer. The film structure was characterized by X-ray diffraction as well as conventional and high-resolution transmission electron microscopy. Both MgO overlayer and β-SiC interlayer had an epitaxial relationship such that MgO (001) (or SiC (001))//Si (001) and MgO [110] (or SiC [110])//Si [110]. No evidence of an amorphous layer was observed at either MgO/SiC or SiC/Si interface. Dielectric properties of the epitaxial MgO thin films on Si (001) were evaluated. from capacitance-voltage (C-V) characteristic of metal-oxide-semiconductor (MOS) structures. The C-V measurements indicated an interface trap density at midgap as low as $10^{11}$ to $10^{12}$ cm$^{-2}$ eV$^{-1}$ and fixed oxide charge of the order of $10^{11}$/cm$^2$ respectively. These results show that an epitaxial MgO thin film on Si by MOMBE has utility as a gate insulator in MOS devices.

In these examples, twinning of MgO layers was not observed by TEM. The prior art, however, reported that direct epitaxial growth of MgO on (100) Si resulted in formation of twinned films presumably due to large lattice mismatch between Si and MgO. In order to obtain untwinned films, a thin layer of Ba$_2$Si several monolayer thick was needed between the Si substrate and the MgO layer. The absence of twins, herein, presumably results from the presence of the SiC interlayer and the smaller lattice mismatch of less than 4% between MgO and SiC. A high density of twins and stacking faults, however, was observed in SiC layer, which presumably resulted from the large misfit strain of 20% between SiC and Si. Thus the SiC interfacial layer can, and appears to, serve as a strain relaxed template for growth of epitaxial MgO that leads to untwinned films. The following results indicate that epitaxial growth of MgO on Si proceeds on a clean interface with low misfit stress between Si and the MgO overlayer.

Figure 11:
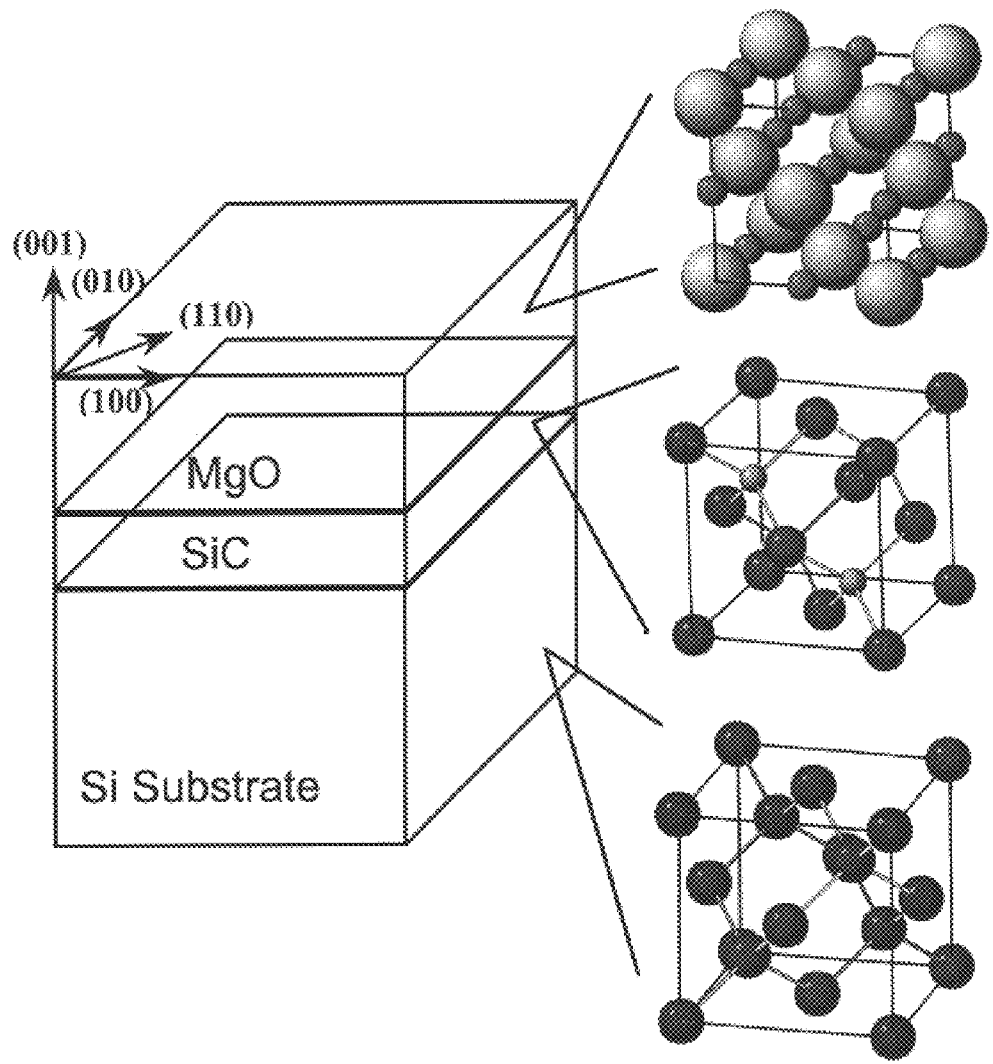
FIG. 11 is a schematic representation of thin films grown in accordance with this invention.

Films were, again, deposited in a SVT Associates SN35 MBE system equipped with a load-lock, low temperature effusion cells and an RF oxygen plasma source. The solid metal-organic precursor Mg (acac)$_2$ was the source, as described above. A schematic of the MOMBE system is shown in FIG. 1. The SiC interlayer was grown on the cleaned and reconstructured Si (001) surface at a substrate temperature of 850–950° C. The precursor was served as the carbon source. The Si was carbonized at a source pressure of $1.0 \times 10^{-7}$ to $1.0 \times 10^{-9}$ Torr for 1–30 minutes in the absence of oxygen. The MgO layer was deposited subsequently on top of the interlayer at a substrate temperature of 700–900° C., a source pressure $1.0 \times 10^{-6}$ Torr, and an oxygen pressure $1.0 \times 10^{-5}$ Torr. The growth conditions for both SiC and MgO are listed in Table 4. FIG. 11 shows a schematic of the grown structure.

TABLE 4

| GROWTH CONDITIONS | INTERLAYER LAYER | OVERLAYER |
|---|---|---|
| GROWTH TEMPERATURE (° C.) | 850–950 | 700–900 |
| RF OXYGEN PLASMA POWER | | 300–450 |
| 0 PRESSURE (TORR) | | $1.0 \times 10^{-5}$ WITH PLASMA |
| SOURCE PRESSURE (TORR) | $1.0 \times 10^{-9}$–$1.0 \times 10^{-7}$ | $-5.0 \times 10^{-7}$–$5.0 \times 10^{-6}$ |
| GROWTH TIME (HOURS) | <1 | 3 |
| FILM THICKNESS (NM) | 10–100 | 10–200 |
| GROWTH RATE (NM/HOUR) | 60–600 | 10–30 |

The microstructure was determined by x-ray diffraction (XRD) using Cu K$_\alpha$ radiation, a Hitachi HF-8100 conventional transmission electron microscope and a Hitachi HF-2000 cold field emission high resolution transmission electron microscope both operated at 200 kV.

MOS capacitor structures were fabricated using MgO as the dielectric layers. The top metal electrodes were thermally evaporated through a shadow mask and consisted of a 200 nm Al adhesion layer covered with 100 nm of Au. The capacitors were 475 μm in diameter. Ohmic contact to the n-type (~7 Ω-cm) Si substrate was made with indium. C-V measurements were made at 100 kHz using an HP4192A impedance analyzer.

Example 16

Figure 12:
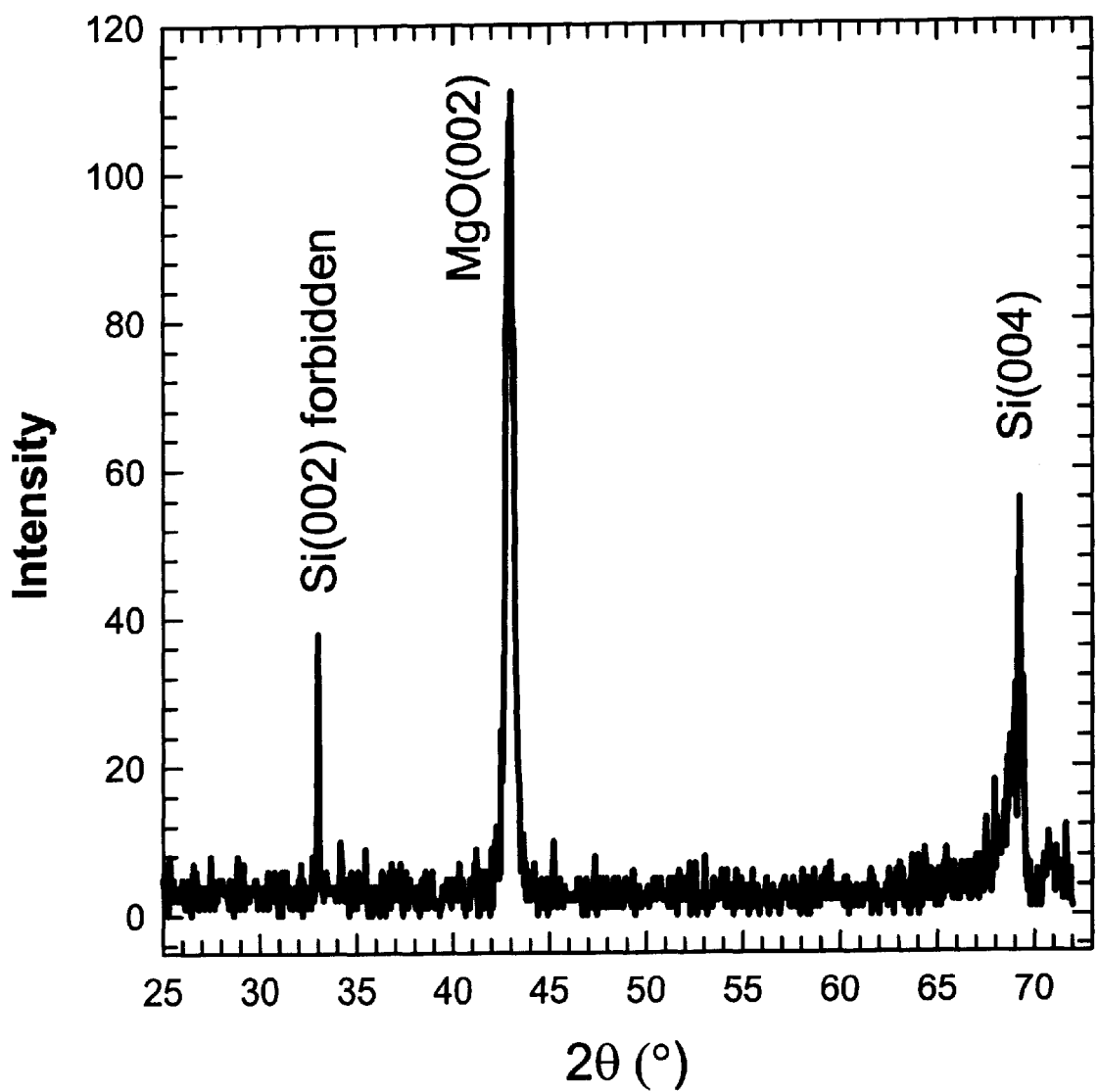
FIG. 12 is an x-ray diffraction (XRD) scan of the bilayer of Example 12.

The orientation off the epitaxial MgO was determined by XRD. FIG. 12 shows a typical θ2θ XRD scan from the epitaxial MgO layer. The dominant diffraction peak is at 2θ=42.9°, which corresponds to the MgO (200) diffraction peak. The peak at 2θ=69.20° is attributed to the (400) Si substrate peak. The peak around 33° was attributed to the Si (200) forbidden reflection. The measured lattice spacing of the MgO film is 4.211 Å. The XRD scan indicates that the overlayer was MgO with its orientation MgO (001)//(001). No other phases or orientations were observed.

Example 17

Figure 13A:
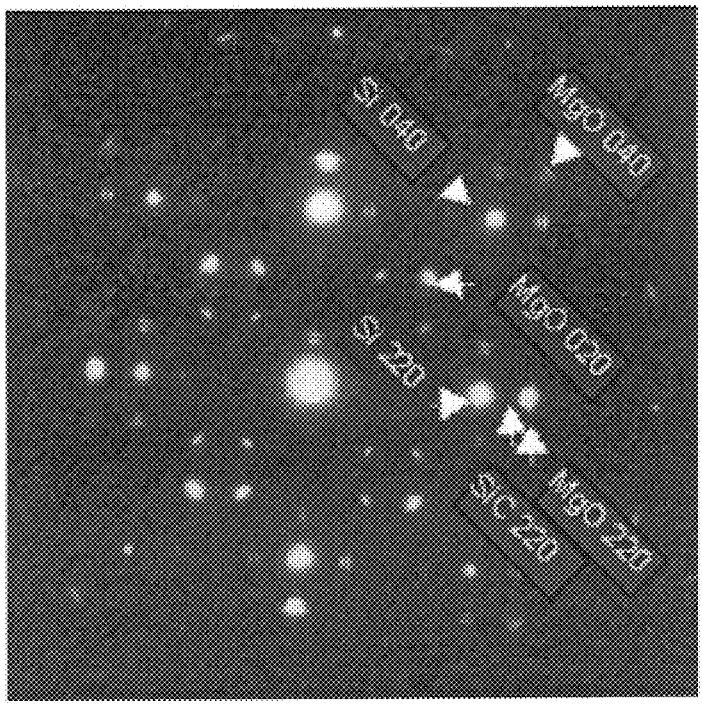
FIG. 13(a) shows an election diffraction pattern from the MgO/SiC/Si composite of Example 17, taken along with Si<100> zone axis.
Figure 13B:
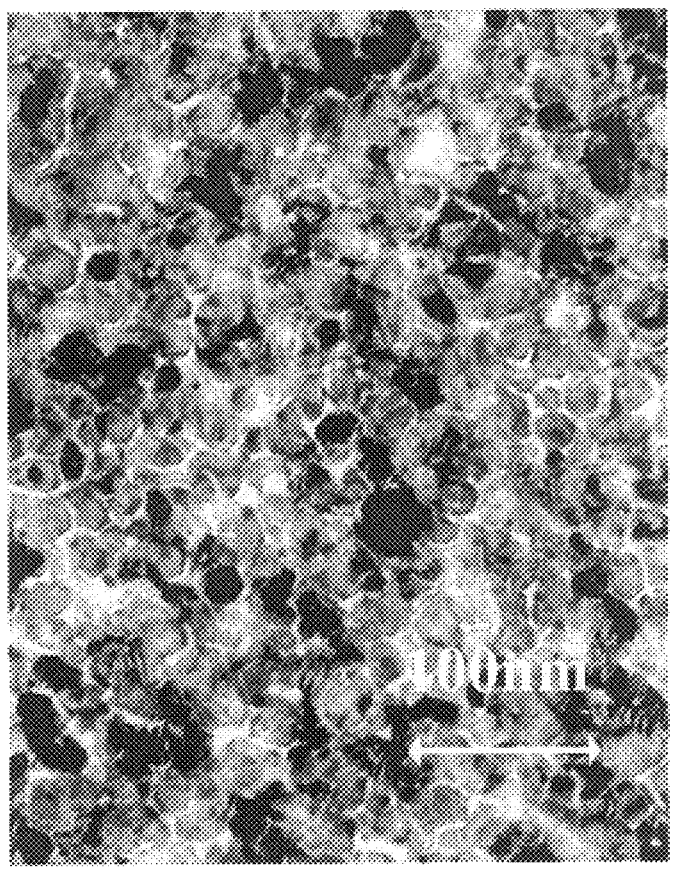
FIG. 13(b) is a bright field TEM micrograph of the same composite.
Figure 14:
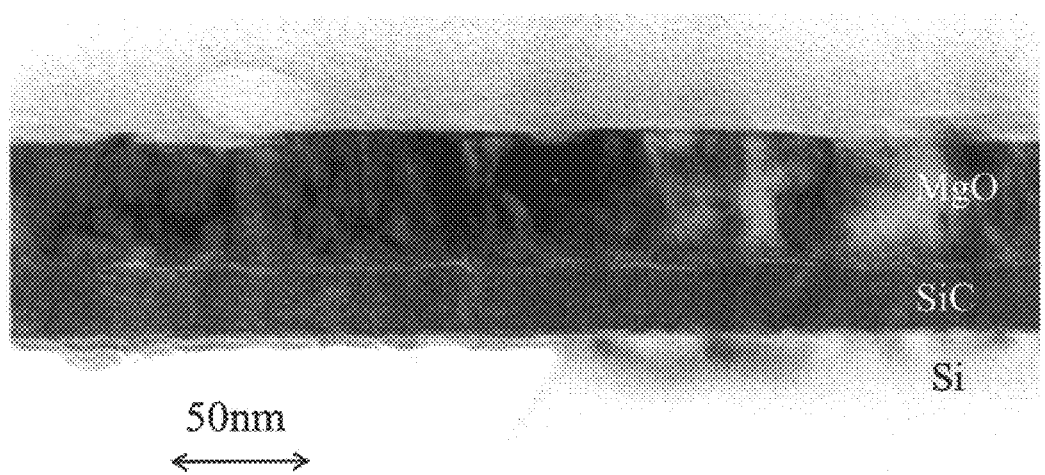
FIG. 14 provides a bright field cross-sectional TEM (XTEM) micrograph of the composite of Example 17.

In order to identify the in-plane orientation and the epitaxial relationship between the MgO, SiC interlayer and Si, plan view TEM samples were examined. FIG. 13(a) shows a plan view electron diffraction pattern along the <001> zone axis from a MgO film. Three sets of diffraction spots are observed. One set, which has the largest lattice constant, is from Si. The second set has a slightly smaller lattice constant but very close to the third set. This set of diffraction spots is from MgO overlayer. The third set is from SiC interlayer. Using the known Si lattice constant (a=5.430 Å) as an internal calibration standard we determined the lattice spacing of the overlayer and interlayer to be a=4.202 Å and a=4.328 Å, respectively. They are in excellent agreement with the lattice constants of MgO (a=4.213 Å) and β-SiC (a=4.349 Å). Note that the measured lattice mismatch of MgO and SiC is less than 4%. The electron diffraction pattern indicates that the overlayer is epitaxial cubic MgO with an orientational relationship of MgO(001)//SiC(001) and MgO [110]//SiC [110]. The observed streakiness of the SiC diffraction spots is presumably associated with the multiple twin band structure of SiC as we will show below. An angular broadening of the MgO and SiC diffraction spots by several degrees was also observed which indicates the MgO overlayer and SiC interlayer consisted of highly (001)-oriented columnar grains with low-angle boundaries. The satellite spots around Si (220) and (040) reflections actually result from double electron diffraction, which is common where two layers of crystals overlap and have a fixed orientation relationship. The morphology of the film was determined from the bright field TEM image as shown in FIG. 13(b). The film contains grains with size in the range of tens of nanometers. It is difficult to distinguish MgO crystallites from SiC crystallites because of overlapping as indicated by the moire fringes. FIG. 14 shows a bright field cross sectional TEM (XTEM) micrograph of the bilayer. Relatively planar and sharp interfaces between the interlayer and the MgO overlayer and the interlayer and Si were observed.

Example 18

Figure 15:
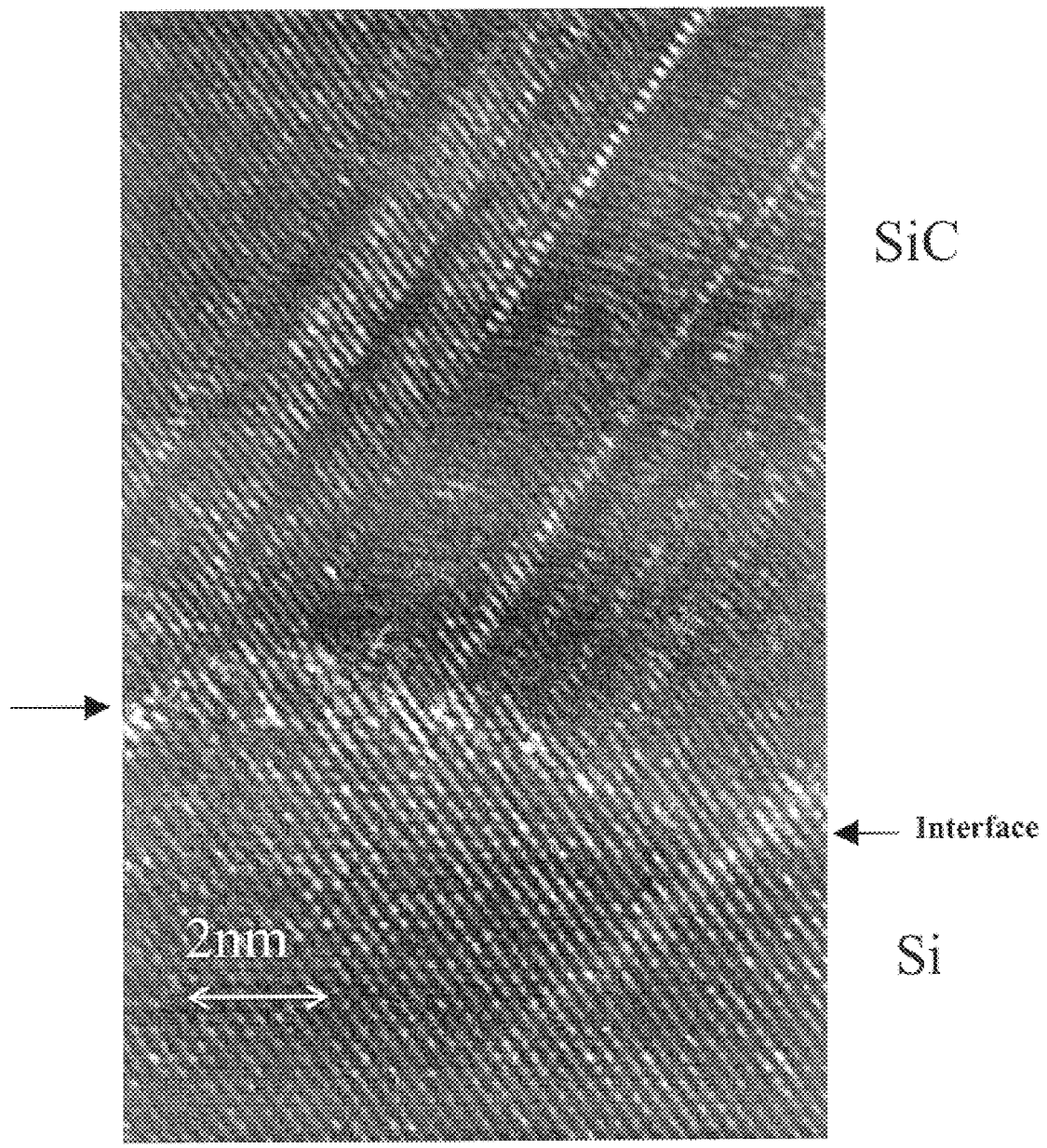
FIG. 15 provides a high resolution XTEM micrograph of the SiC/Si interface of the composite of Examples 17 and 18.
Figure 16:
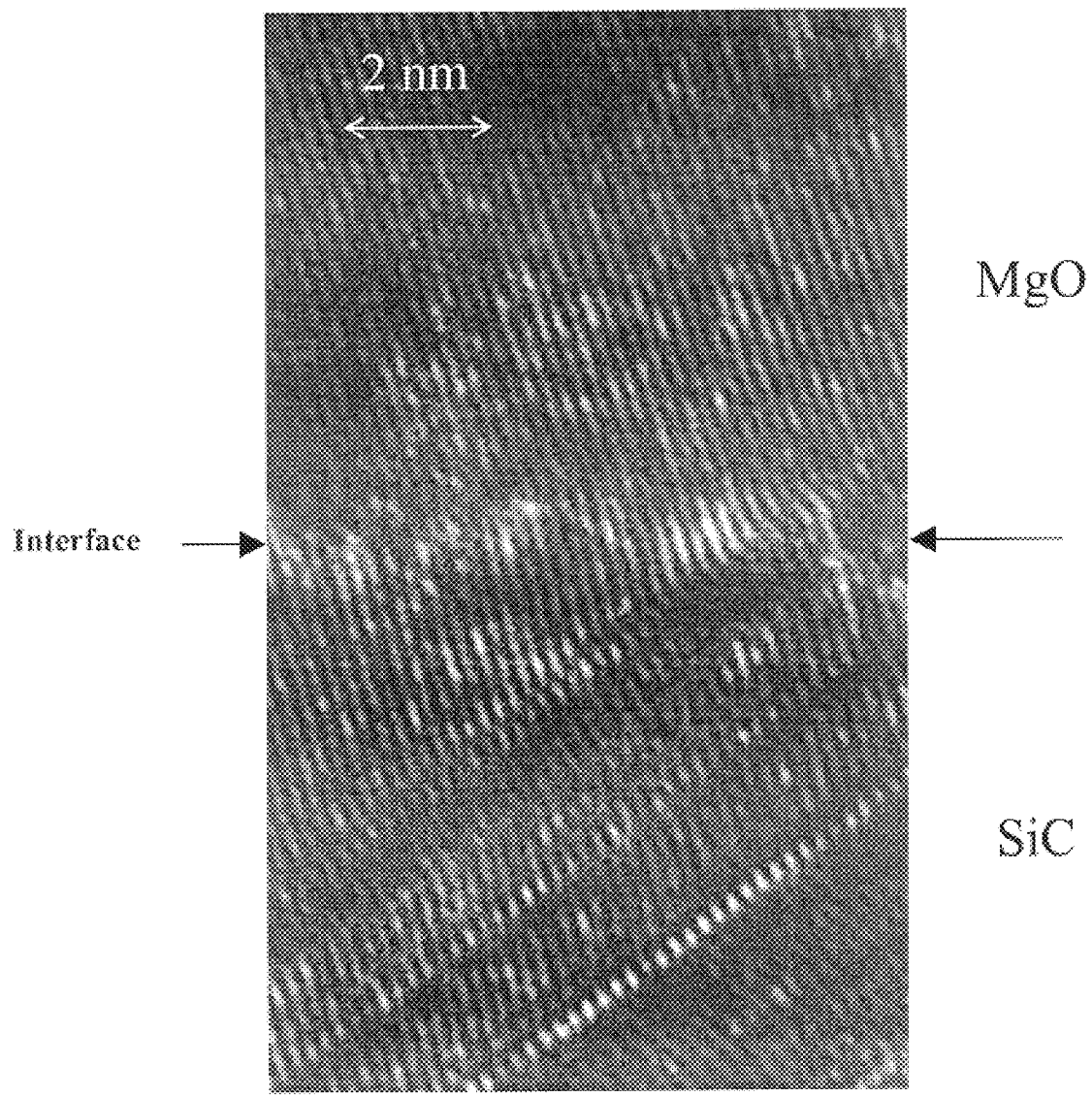
FIG. 16 provides a high resolution XTEM micrograph of the MgO/SiC interface of the composites of Examples 17 and 18, taken with the same orientation shown in FIG. 15.

To determine whether or not an amorphous phase was formed at the interfaces between Si/SiC and SiC/MgO during growth, high resolution XTEM was used. FIG. 15 shows a high resolution XTEM micrograph of the Si/SiC interface. The electron beam direction is nearly parallel to the Si <110> zone axis. The lattice fringes in the Si substrate and SiC region which are from Si {111} and SiC {111} atomic planes, respectively are parallel to each other, indicating a good epitaxial relationship. No evidence of an amorphous phase was observed at the interface. However, the SiC crystallites indicated a multiple twin structure with {111 } planes as twin boundaries and stacking faults. FIG. 16 shows a high resolution XTEM micrograph of the interface between the SiC interlayer and MgO overlayer taken with the same orientation as in FIG. 15. The parallel lattice fringes in the MgO overlayer and SiC interlayer that are from MgO {111} and SiC {111} atomic planes, respectively, are parallel to each other, indicating epitaxy between MgO and SiC. Again, no evidence of an amorphous phase was observed. In addition, no twinning in the MgO overlayer was noted.

Example 19

Figure 17:
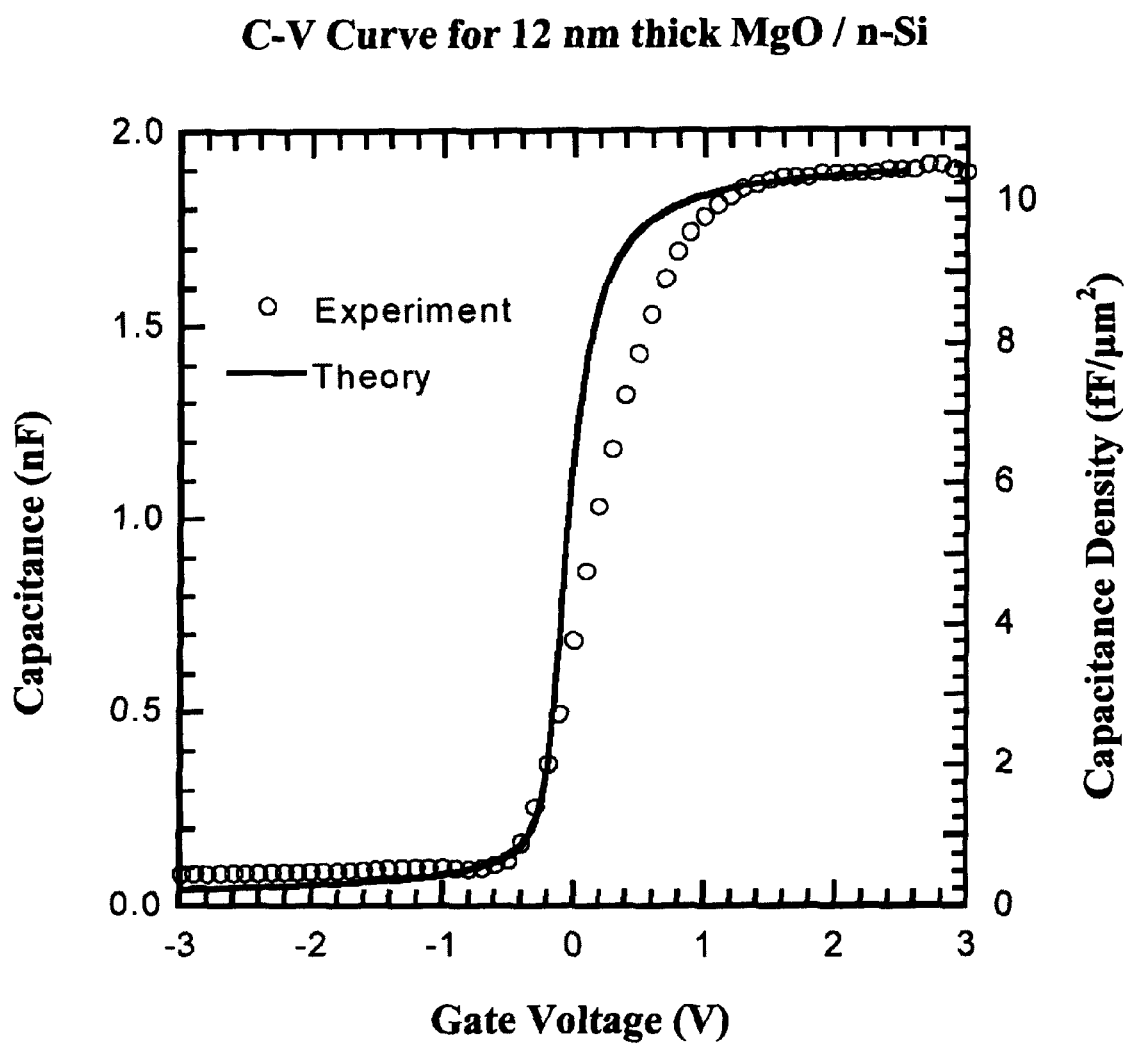
FIG. 17 graphically plots the capacitance-voltage (C-V) relationships observed with a MOS structure having an insulating layer/film of MgO, such structure as described in Example 19. The plot is a fit with the theoretical C-V dependence.

To determine the dielectric properties of the epitaxial MgO layer, MOS capacitors were fabricating using epitaxial MgO as the insulating layer. A typical C-V curve is shown in FIG. 17 for a 12 nm thick MgO layer grown on 30 nm of SiC interlayer. The C-V measurements showed the expected dependence of the high frequency capacitance on bias voltage. Negligible hysteresis was observed. The C-V data is compared to theoretical calculation. A dielectric constant of ~12 is calculated from the saturated capacitance under accumulation conditions. This corresponds to an effective $SiO_2$ thickness of ~3 nm for the 12 nm thick MgO film. This value is similar to that reported for epitaxial $SrTiO_3$ on Si. A shift in the flat band voltage of approximately 0.5 V was observed. This shift is attributed to charged defects in the MgO layer with a density of $~10^{11}/cm^2$. The C-V dependence was often stretched out along the voltage axis compared to the theoretical dependence, as shown in FIG. 17, suggesting the presence of trapped charge at the SiC/MgO interface. From this effect we estimate the density of interface trapped charge on the order of $10^{11}$ to $10^{12}$ $eV^{-2}cM^{-2}$ at midgap. These values are comparable to those previously reported for MgO/Si capacitor grown by RF sputtering. The MOS devices showed leakage current, $~0.3$ $A/cm^2$ at 1 MV/cm. The leakage current was independent of the thickness of the film, suggesting the presence of pinholes in the oxide layer. Pinholes have been observed in the films by TEM and are a result of etch pits in the Si substrate formed by Si outdiffusion during carbonization. Presumably the leakage current can be improved by reducing the number and size of the pit defects by limiting the thickness of the SiC interlayer to a few monolayers.

Various other benefits, features and aspects of this invention, especially as they pertain to use and incorporation of carbonized substrate interlayers, are further illustrated in Examples 20–27, below, with the experimental procedures :and results as provided.

The films were, again, deposited in a SVT Associates SN35 MBE system equipped with a load-lock, low temperature effusion cells and an oxygen plasma source. The solid metalorganic precursor was contained in an effusion cell. The schematic of the MOMBE system has been reported elsewhere. The cell temperature can be precisely controlled to less than 0.2° C. Mg. $(acac)_2$ (acac=acetylacetonate) was used as the precursor. The source flux pressure was controlled by a flux monitor. An oxygen plasma from a SVT rf plasma $O_2$ gun with an output energy of 400 W was used as an oxidant. The substrate was resistively heated. The substrate temperature was measured by a thermocouple calibrated by an infrared optical pyrometer.

N-type Si (100) wafers, 3 in. in diameter, with resistivities of 1–10 Ωcm were used as substrates. Prior to growth, the Si surface was chemically etched in a $HNO_3$:HF:$H_2O$ (5:3:92 by volume percentage) solution for several seconds to remove the surface oxide layer and then was subsequently cleaned in methanol and acetone for 15 min. The chemically etched Si wafer was immediately placed in the system load lock and then transferred to the growth chamber pre-pumped down to a base pressure of $10^{-9}$–$10^{-10}$ Torr. The Si was subsequently degassed for 30 min at 200° C. and desorped for 30 min at 850° C. The Si surface cleaned by this simple procedure showed a clear and streaky RHEED pattern with Kikuchi lines indicating the Si surface was atomically clean.

TABLE 5

MOMBE growth conditions for the interlayer and overlayer.

| Growth conditions | Interlayer layer | Overlayer |
|---|---|---|
| Growth Temperature (° C.) | 850–950 | 700–900 |
| RF oxygen plasma power (W) |  | 300–400 |
| O pressure (Torr) | 0–10⁻⁷ | (1 – 3) × 10⁻⁵ with O plasma |
| Source pressure (Torr) | 1.0 × 10⁻⁹–1.0 × 10⁻⁷ | 1.0 × 10⁻⁶ |
| Growth time (hours) | 0.25–1 | 3–5 |
| Film thickness (mm) | 20–100 | 10–200 |
| Growth rate (nm/h) | 10–30 | 10–30 |

The SiC interlayer was grown on the treated Si(001 ) surface at a substrate temperature of 850–950° C. The SiC layer was grown by exposing the hot silicon substrate to the Mg(acac)$_2$ at a source pressure of 1.0×10$^{-7}$ Torr without the presence of oxygen for 1–60 min. Subsequently the MgO layer was grown on top of the interlayer at a substrate temperature of 700–900° C. at a source pressure 1.0×10$^{-6}$ Torr and oxygen pressure 3.0×10$^{-5}$ Torr. Table 5 lists the typical growth conditions for preparing the MgO film by MOMBE.

The film thickness was measured by a Tencor P-10 surface profiler. The film composition was measured by a Physical Electronics Auger electron spectrometer. The microstructure was determined by an x-ray diffractometer using CuK$_\alpha$ radiation, an Hitachi HF-8100 conventional transmission electron microscope and an Hitachi HF-2000 cold field emission high resolution transmission electron microscope both operated at 200 kV. TEM samples were prepared by mechanical grinding and polishing followed by further mechanical dimpling to a thickness of less than 10 $\mu$m and final thinning in a Gatan Model 691 precision ion polishing system. The film surface morphology and roughness were examined by a Naposcope III atomic force microscope with a Si$_3$N$_4$ tip.

Example 20

Figure 18A:
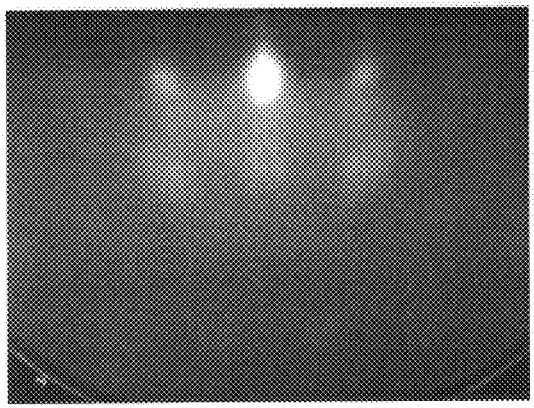
FIGS. 18(a)–(d) provide RHEED patterns from a representative Si and SiC surface, as more fully described in Example 20.
Figure 18B:
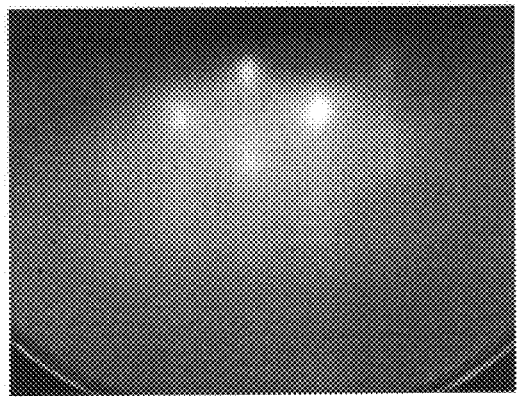
Figure 18C:
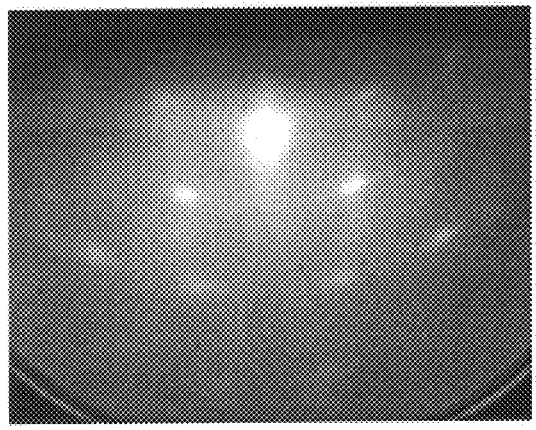
Figure 18D:
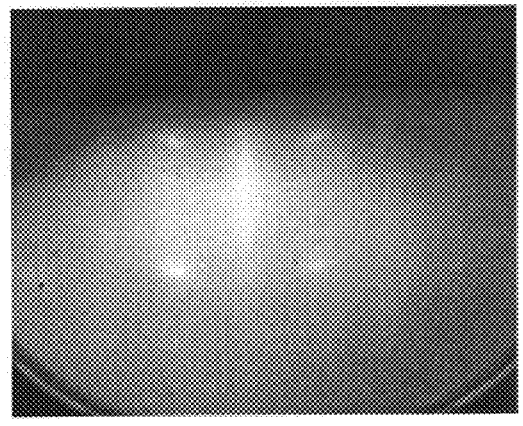

Prior to formation of the interlayer the Si was heated to 900° C. and a reconstructed Si(001) surface was obtained. For comparison RHEED patterns from the reconstructed Si(001) 2×1 surface prior to growth are shown in FIG. 18(a) for the <100> azimuth and in FIG. 18(b) for the <110> azimuth. After exposing the reconstructed Si surface to the metalorganic precursor at 900° C. after 15 min, sharp characteristic single crystal RHEED patterns were observed as shown in FIG. 18(c) for <100> azimuth and FIG. 18(d) for <110> azimuth. RHEED analysis indicated that the interlayer was epitaxial.

Figure 19:
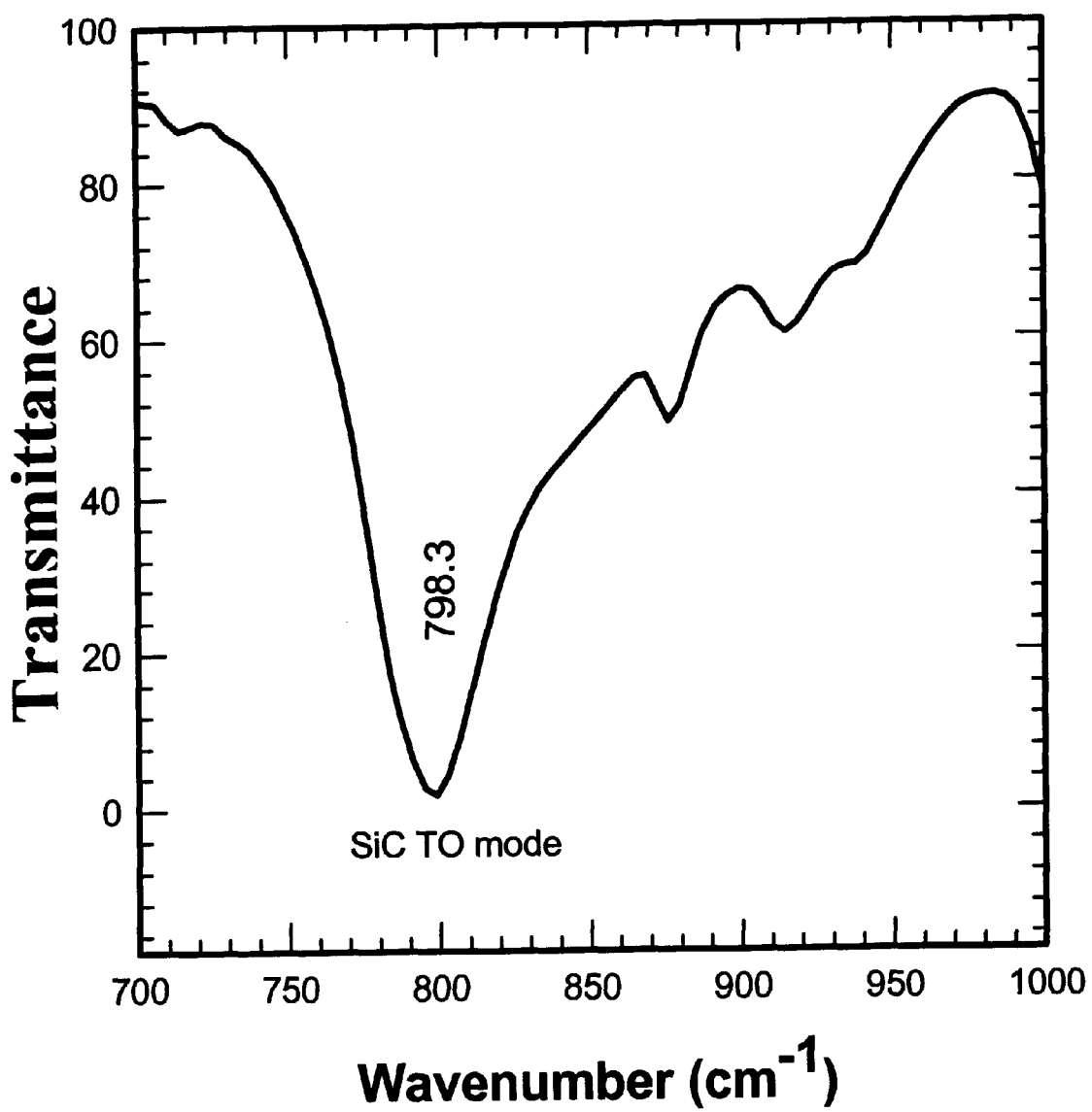
FIG. 19 shows a partial FTIR spectrum of the SiC interlayer of Example 20.

Fourier-transform infrared (FTIR) measurements of the carbonized Si surface layer. confirmed the presence of SiC. FIG. 19 shows a FTIR transmittance spectrum from a 200-nm-thick interlayer grown on Si. A well resolved absorption peak at 798.62 cm$^{-1}$ was observed which is in good agreement with the SiC characteristic stretching vibration [transverse optical (TO) mode] between Si and C atoms at 797 cm$^{-1}$.

Example 21

In order to identify the in-plane orientation of the interlayer, plan view, TEM samples were examined. The FIG. 20 inset shows the <001> zone axis electron diffraction pattern from an interlayer grown on Si. There were two sets of diffraction patterns observed, the one with a larger lattice constant is from Si(001) substrate and the other with a smaller lattice constant is from the interlayer as determined by indexing. Using the known Si lattice constant (a=5.430 Å) as, an internal calibration standard, we determined the lattice spacing of the interlayer to be a=4.328 Å. This is in excellent agreement with the lattice constant of bulk β-SiC (a=4.349 Å). Note that the interlayer and Si have an in-plane orientation relationship: interlayer {220}≡Si{220} and interlayer {040}≡Si{040}. Thus it can be concluded that the interlayer is epitaxial SiC with an orientational relationship of SiC(001)≡Si(001) and Sic[110]≡Si[110]. The observed streakiness of the TEM diffraction spots is possibly associated with the multiple twin band structure of SiC as we will show below. An angular broadening of the SiC diffraction spots by a few degrees was observed which indicates the SiC layer is highly (001) oriented consisting of columnar grains with low-angle boundaries. The satellite spots around Si(220) and (040) reflections actually result from double electron diffraction, which is common where two layers of crystals overlap and have a fixed orientation relationship.

Figure 20:
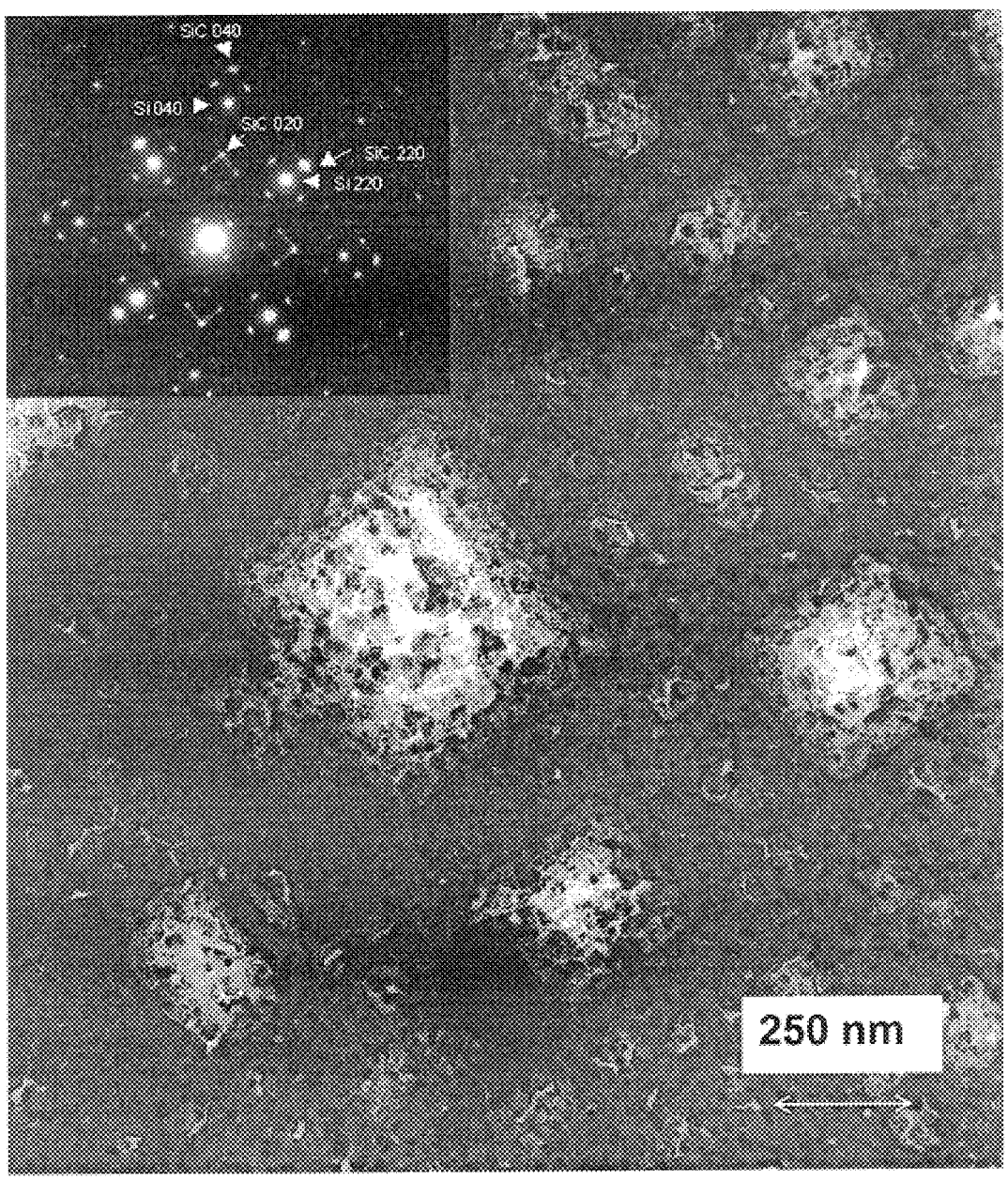
FIG. 20 is a bright field TEM micrograph from the SiC interlayer of Example 21. The inset is an electron diffraction pattern taken along the Si<100> zone axis.
Figure 21:
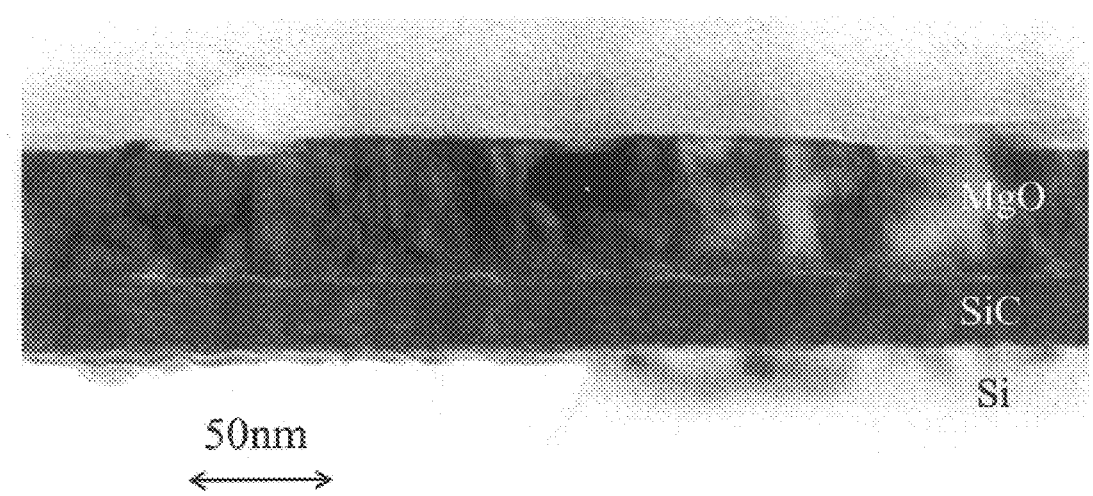
FIG. 21 shows a bright field XTEM micrograph of the composite of Example 21.

FIG. 20 shows a bright field TEM micrograph from the interlayer grown on Si. The irregular dark spots are SiC crystallites with an average size of 20 nm. Large rectangular pits were also observed. FIG. 21 shows a bright field cross sectional TEM (XTEM) micrograph from the film. Flat and sharp interfaces between the interlayer and the MgO overlayer and the interlayer and Si and were observed. The MgO film shows columnar growth with a flat surface.

Example 22

Figure 22:
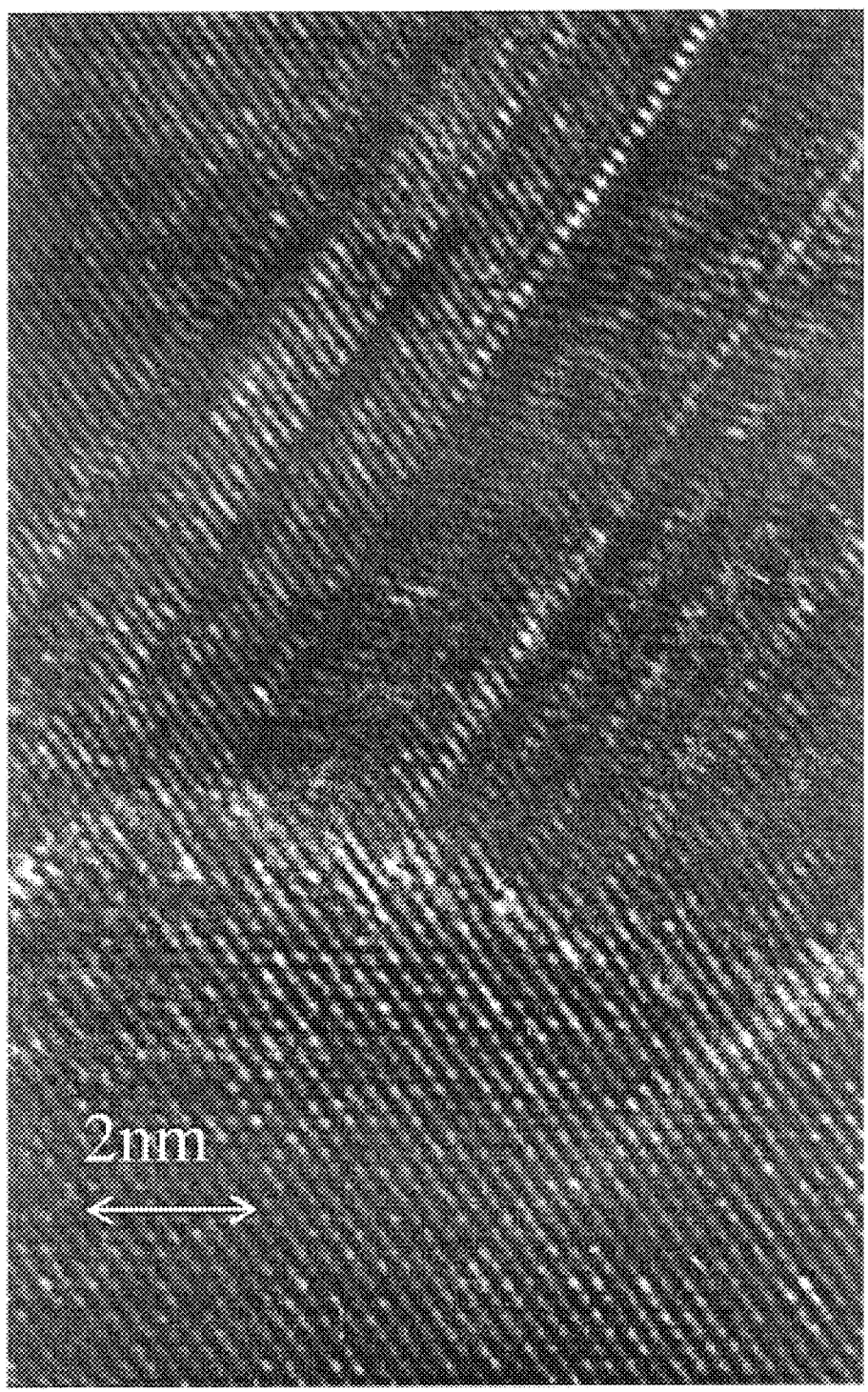
FIG. 22 shows a high resolution XTEM micrograph of the composite of Examples 21 and 22.

To determine whether or not an amorphous phase was present at the interface between the Si and the SiC interlayer, high resolution XTEM was used to resolve the interface. FIG. 22 shows a high resolution XTEM micrograph from the same film. The electron beam direction is nearly parallel to the Si <110> zone axis. The parallel lattice fringes in Si substrate and SiC are from Si{111} and SiC{111} atomic planes, respectively. The interlayer exhibited good epitaxy with the Si substrate. No evidence of an amorphous phase was observed at the interface. Furthermore, the SiC crystallites indicated a multiple twin structure with {111} planes as twin boundaries and stacking faults. FIGS. 23(a) and (b) show AFM micrographs of the SiC interlayer. FIG. 23(a) is taken in the height mode and FIG. 23(b) is in the deflection mode. The surface morphology consisted of a dense array of rectangular islands. The average surface rms roughness is 3.6 nm.

Example 23

Figure 24A:
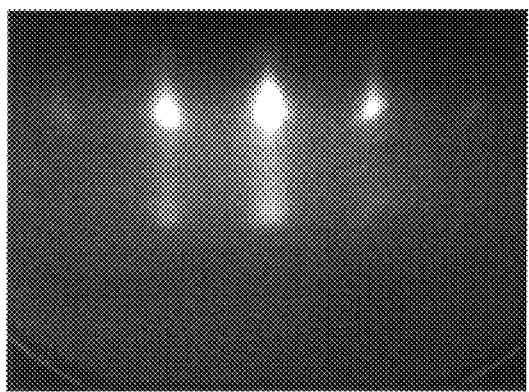
FIGS. 24(a)–(b) exhibit RHEED patterns from the surface of the MgO layer of the composite of Example 23: (a), along <100> azimuth and (b), along <110> azimuth.
Figure 24B:
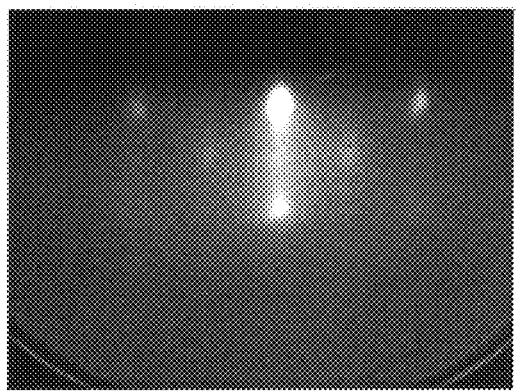

MgO layers were subsequently grown on the SiC interlayer. The RHEED pattern of the MgO overlayer had cubic symmetry as shown in FIG. 24(a) for <100> azimuth and FIG. 24(b) for <100> azimuth. It was observed that the overlayer and Si surface have an epitaxial relationship: MgO(001)≡Si(001) and MgO[110]≡Si[110]. In some cases weak RHEED rings were also found superimposed on single crystal RHEED patterns, which indicates existence of some polycrystalline regions in the films.

Example 24

Figure 25:
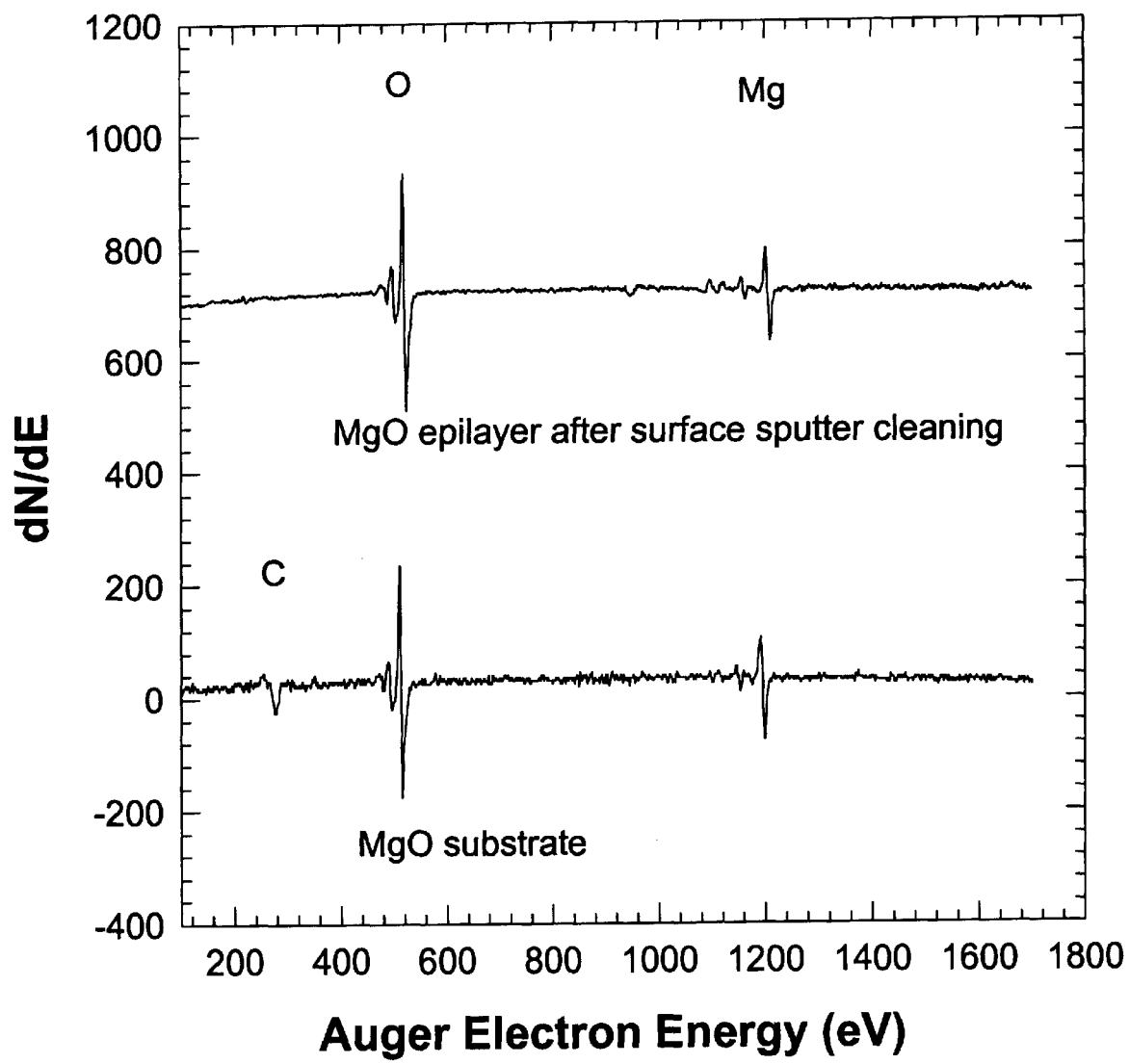
FIG. 25 shows AES spectra for an MgO overlayer in accordance with this invention and, comparatively, an MgO substrate.

To determine the chemical composition of the film, AES spectra were measured. FIG. 25 shows an AES spectrum from the MgO overlayer after the surface was sputter cleaned for 5 min and a spectrum from a MgO single crystal substrate. The spectrum from the overlayer indicates the presence of only Mg and O. No carbon contamination was observed in addition, the peak-to-peak ratio of Mg and O from the interlayer is very close to that of the MgO substrate, which indicates the interlayer is stoichiometric.

Example 25

Figure 26:
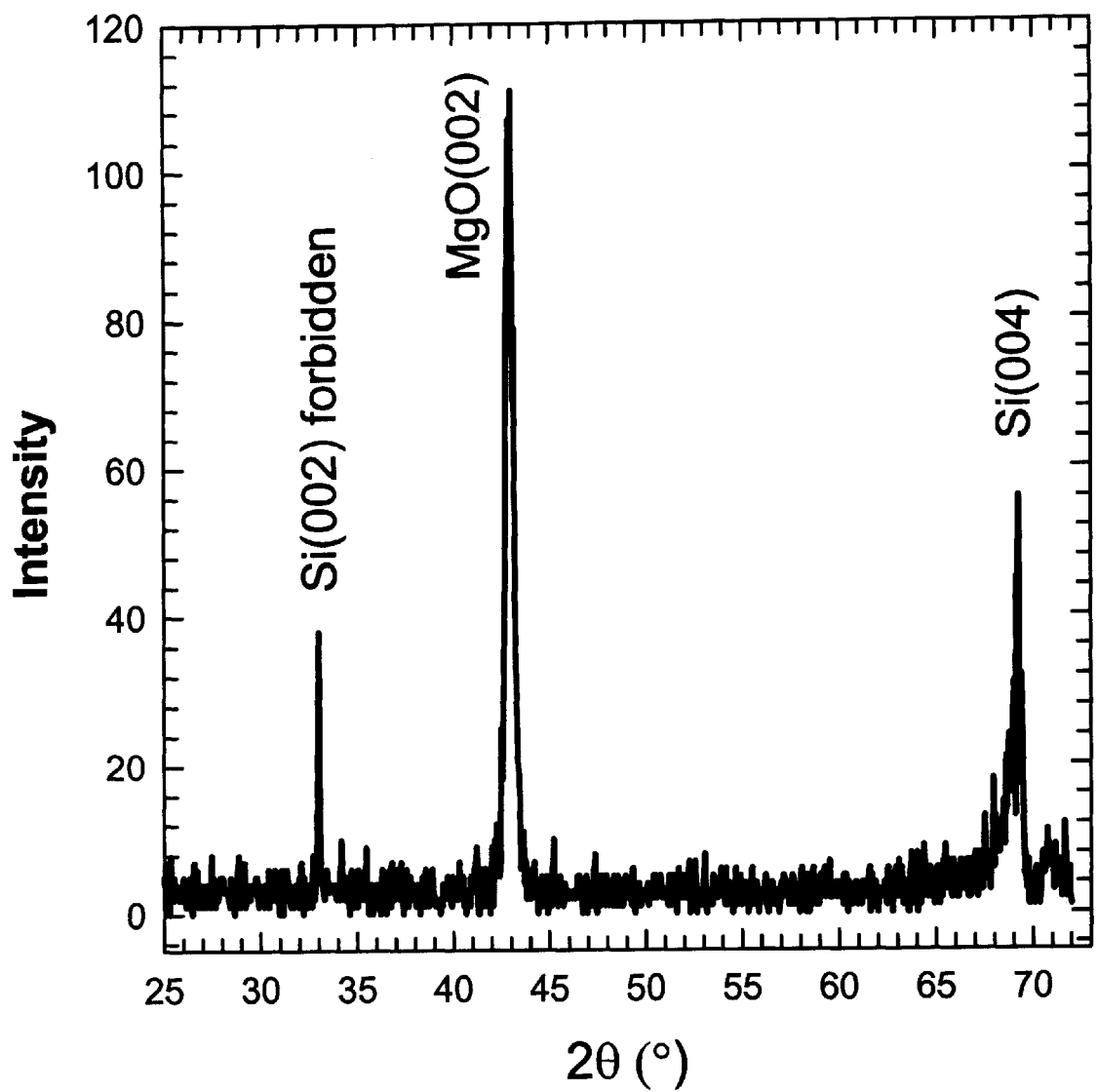
FIG. 26 provides an XRD scan from an MgO layer/film, as further described in Example 25.

XRD was used to verify phase purity and orientation as well as determine the lattice parameter of the deposited MgO. FIG. 26 shows a typical θ-2θ XRD scan from the MgO layer. The dominant diffraction peak is at 2θ42.9°, which corresponds to the MgO (200) diffraction. Several other diffraction peaks were observed. The peak at 2θ=69.2° is attributed to the (004) Si substrate peak. The peak around 33° was attributed to the Si (002) forbidden reflection. The measured lattice spacing of MgO is 4.211 Å. The pattern confirms that the overlayer was MgO with its orientation MgO(001)≡Si(001). No other phases or orientations were observed.

Example 26

Figure 27:
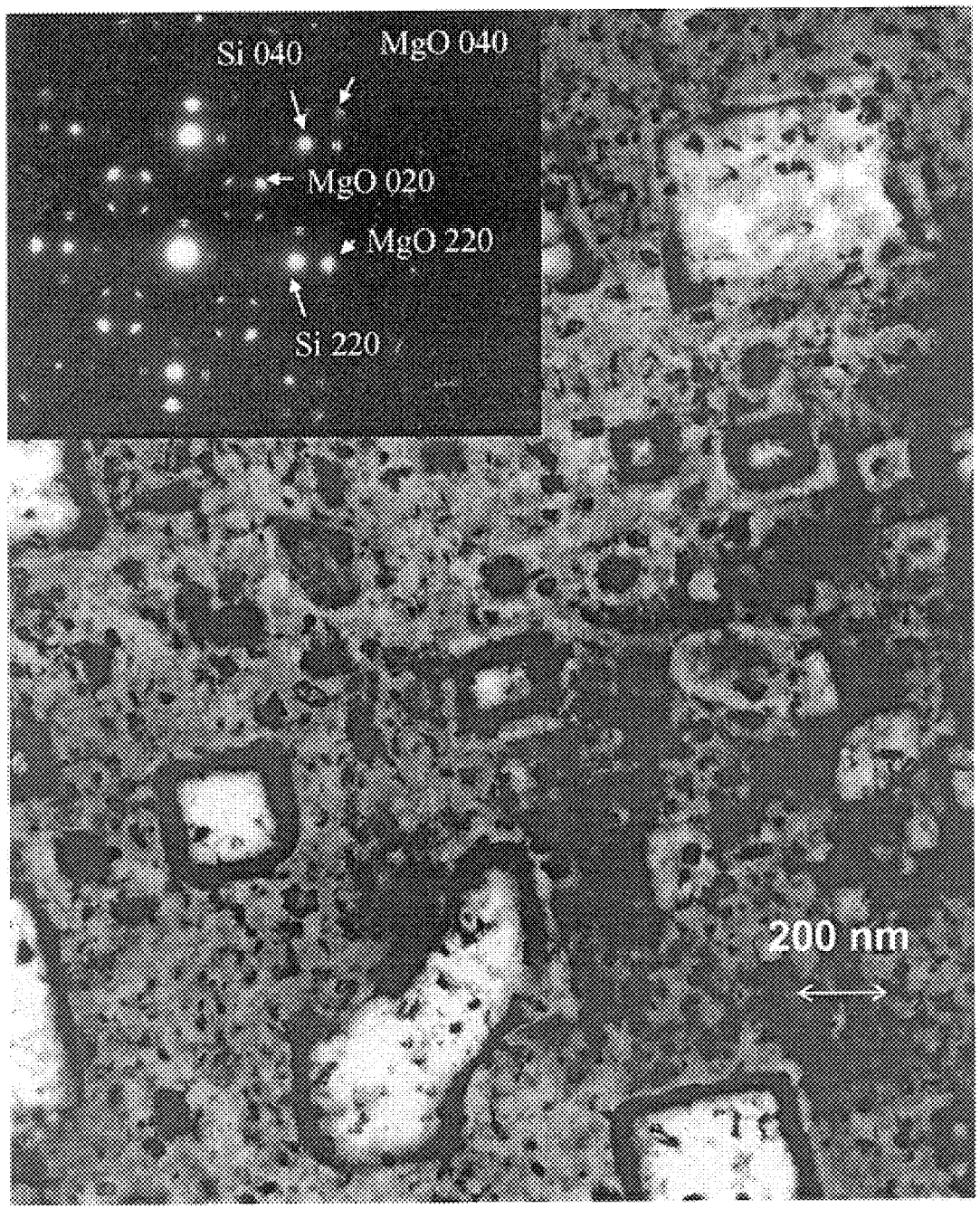
FIG. 27 is a bright field TEM micrograph from the MgO film of Example 26. The inset shows an electron diffraction pattern taken along the Si<100> zone axis.

The epitaxial relationship between the MgO and the Si is further illustrated by TEM results. The FIG. 27 inset shows a plan view election diffraction pattern along the <001> zone axis from a MgO film. An additional set of diffraction spots is observed that is very close to the second set as previously shown in FIG. 20, but with a slightly smaller lattice constant. This set of diffraction spots is from the overlayer. The measured lattice constants are α=4.328 and α=4.202 Å for the interlayer and overlayer, respectively as listed in Table 6. They are in excellent agreement with the respective lattice constants of β-SiC (α=4.349 Å) and MgO (α=4.213 Å). Note that the measured lattice mismatch of MgO and SiC is less than 4%. From the electron diffraction pattern it is confirmed that the overlayer is epitaxial cubic MgO with an orientational relationship of MgO(001)≡SiC(001) and MgO[110]≡SiC[110]. Furthermore, no twinning of the MgO layer was observed. TEM results are consistent with the RHEED and XRD results. The morphology of the film was determined from the bright field TEM image. FIG. 27 shows a bright field micrograph from the MgO epitaxial film. The film consists of dense small dark spots and some rectangular pits. A similar morphology was also observed in the interlayer as previously shown in FIG. 20. It is difficult to distinguish MgO crystallites from SiC crystallites because of overlapping as indicated by the moire fringes. The rectangular pits observed in FIGS. 20 and 27 have been reported to be associated with etch pits in Si substrates resulting from Si out-diffusion during carbonization.

TABLE 6

Measured lattice spacing of the interlayer and overlayer by TEM.

| Atomic planes | Measured Lattice spacing for SiC(Å) | Measured Lattice Spacing For MgO(Å) | Lattice spacing for Si(Å) | Lattice spacing for cubic SiC(Å) | Lattice spacing for cubic MgO(Å) |
|---|---|---|---|---|---|
| {400} | 1.082 | 1.050 | 1.357 | 1.087 | 1.053 |
| {220} | 1.540 | 1.481 | 1.920 | 1.538 | 1.489 |
| Lattice constant | 4.328 | 4.202 | 5.430 | 4.349 | 4.213 |

Example 27

Figure 28:
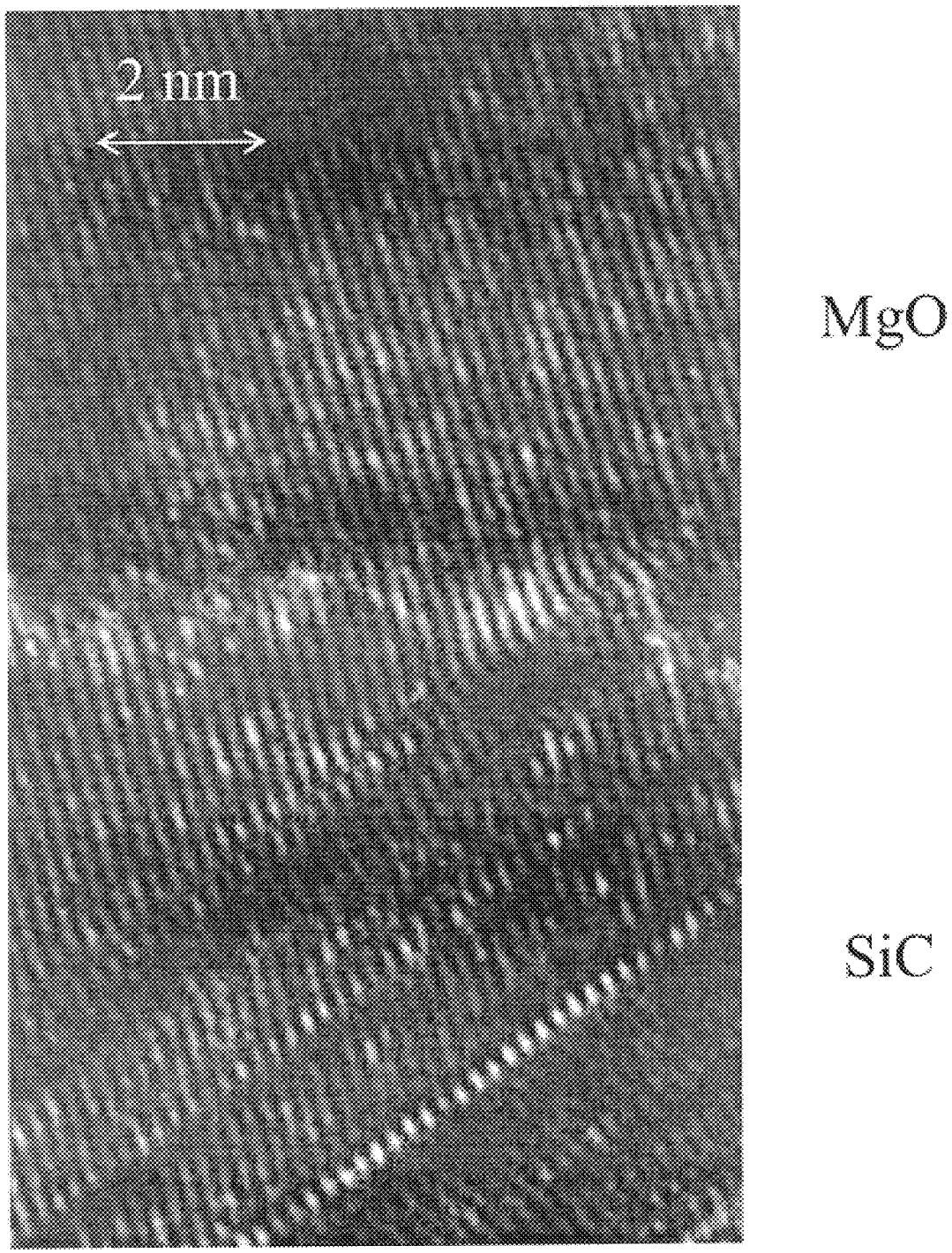
FIG. 28 is a high resolution XTEM micrograph at a SiC/MgO interface, as described in Example 27.
Figures 29A, 29B:
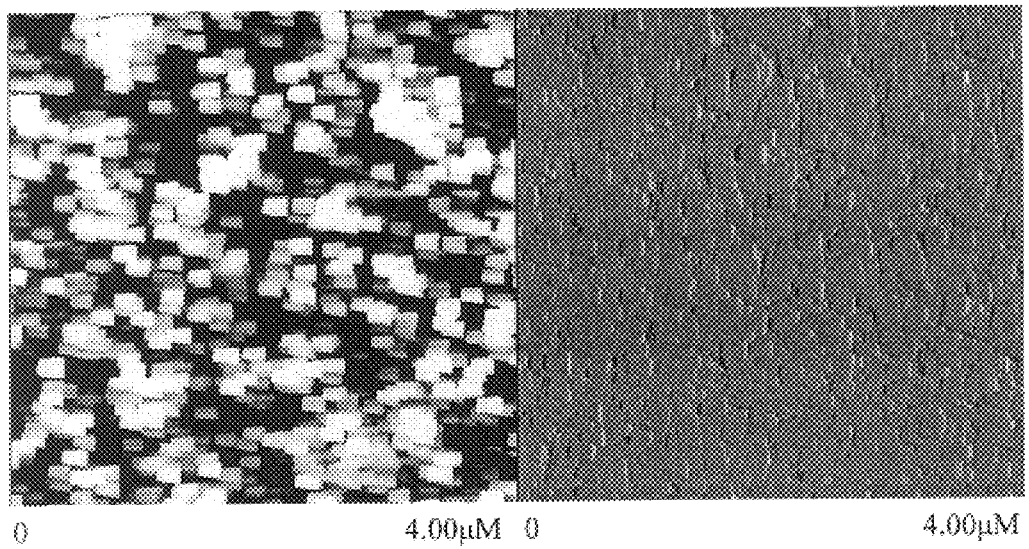
FIGS. 29(a)–(b) provide AFM micrographs of the MgO surface, of the composite of Example 27, taken in the (a) height mode, and (b) deflection mode.

FIG. 28 shows a high resolution XTEM micrograph at the interfacial area between the SiC interlayer and MgO overlayer taken with the electron beam nearly parallel to the MgO <110> zone axis. The parallel lattice fringes in MgO and SiC are from their {111} atomic planes, respectively. Both the SiC interlayer and the MgO overlayer exhibited a good epitaxial relationship with the Si substrate. No evidence of an amorphous phase was observed. In. addition, no twinning in the MgO overlayer was observed. FIGS. 29(a) and (b) show the surface AFM micrograph of the overlayer. FIG. 29(a) is taken in the height mode and FIG. 29(b) is in the deflection mode. Again rectangular islands were observed with average island size of 200 nm. The average surface RMS roughness is 4.9 nm.

While the principles of this invention have been described in connection with specific embodiments, it should be understood clearly that these descriptions, along with the chosen figures, charts, tables and examples, together with the data provided therein, are made only by way of example and are not intended to limit the scope of this invention, in any manner. For example, the inventive thin film materials and methods of preparation have been demonstrated with respect to magnesium oxide and various precursors; however, and as would be well known to those skilled in the art made aware of this invention, this, invention can be utilized with various other precursors and the resulting thin film materials. Other advantages and features of this invention will become apparent for many claims filed in conjunction herewith, with the scope thereof determined by the reasonable equivalents, as would be understood by those skilled in the art.

What is claimed:

1. A method of depositing a metal oxide layer on a substrate, said method comprising:

providing a substrate;

providing a solid metal-organic precursor compound; and depositing a film of metal oxide on said substrate by molecular beam epitaxy deposition, said metal oxide the oxidation product of said precursor compound and an oxygen source, said deposition substantially without substrate oxidation.

2. The method of claim 1 wherein said oxygen source is oxygen plasma.

3. The method of claim 1 wherein said metal-organic compound provides an oxide selected from the group consisting of refractory metal oxides and reactive metal oxides.

4. The method of claim 3 wherein said metal-organic compound is a magnesium compound, said magnesium compound a precursor for magnesium oxide.

5. The method of claim 4 wherein said film is stoichiometric, phase-pure crystalline magnesium oxide.

6. The method of claim 5 wherein said film is epitaxial.

7. The method of claim 1 wherein said substrate is heated to a temperature of less than about 1000° C.

8. The method of claim 7 wherein said substrate is silicon and said substrate temperatures are between about 500° C. and about 1000° C.

9. The method of claim 1 wherein said deposition is at a rate dependent upon said metal-organic compound partial pressure.

10. The method of claim 1 further including formation of an epitaxial carbide layer on said substrate before deposition of said metal oxide film.

11. The method of claim 10 wherein said metal-organic compound is a precursor for said carbide layer, said formation by exposing said substrate to said precursor in the absence of an oxygen source.

12. A composite comprising a substrate and a metal oxide film thereon, said composite substantially absent substrate oxidation, said oxide film substantially absent carbon contamination, said composite further including an epitaxial carbide layer between said substrate and said oxide film, said film produced by metal-organic molecular beam epitaxy deposition, said deposition under oxygen pressures less than about $10^{-3}$ Torr and a substrate temperature of less than about 1000° C.

13. The composite of claim 12 wherein said metal oxide is selected from the group consisting of refractory metal oxides and reactive metal oxides.

14. The composite of claim 13 wherein said metal oxide is a refractory metal oxide having bulk dielectric properties.

15. The composite of claim 14 wherein said metal oxide is an epitaxial film.

16. The composite of claim 15 wherein said metal oxide is magnesium oxide.

17. The composite of claim 12 wherein said metal oxide is stoichiometric and has a phase-pure crystalline morphology.

18. The composite of claim 17 where said metal oxide is an epitaxial magnesium oxide film.

19. The composite of claim 12 wherein said carbide layer is the carbonization product of said substrate and a metal-organic compound under molecular beam epitaxy conditions, said conditions absent the presence of an oxygen source.

* * * * *

UNITED STATES PATENT AND TRADEMARK OFFICE
CERTIFICATE OF CORRECTION

PATENT NO. : 6,605,151 B1
DATED : August 12, 2003
INVENTOR(S) : Bruce W. Wessels, Brent H. Hoerman and Feng Niu It is certified that error appears in the above-identified patent and that said Letters Patent is hereby corrected as shown below:

Column 9,
Line 42, "Was" should be -- was --

Column 12,
Line 42, "metalorgaric" should be -- metalorganic --

Column 14,
Line 60, "// (001)" should be -- // Si (001) --

Column 18,
Line 54, "2θ42.9º" should be -- 2θ=42.9º --

Column 20,
Line 62, "epitaxy conditions," should be -- epitaxy deposition conditions --

Signed and Sealed this

Twenty-seventh Day of January, 2004

JON W. DUDAS
*Acting Director of the United States Patent and Trademark Office*